US009909060B2

(12) United States Patent
Hirosaki et al.

(10) Patent No.: US 9,909,060 B2
(45) Date of Patent: Mar. 6, 2018

(54) PHOSPHOR, LIGHT-EMITTING DEVICE, IMAGE DISPLAY DEVICE, PIGMENT, AND ULTRAVIOLET ABSORBER

(71) Applicant: National Institute for Materials Science, Ibaraki (JP)

(72) Inventors: Naoto Hirosaki, Ibaraki (JP); Takashi Takeda, Ibaraki (JP); Shiro Funahashi, Ibaraki (JP); Eiichirou Narimatsu, Ibaraki (JP)

(73) Assignee: National Institute for Materials Science, Tsukuba-shi (JP)

( * ) Notice: Subject to any disclaimer, the term of this patent is extended or adjusted under 35 U.S.C. 154(b) by 143 days.

(21) Appl. No.: 15/038,836

(22) PCT Filed: Nov. 21, 2014

(86) PCT No.: PCT/JP2014/080974
§ 371 (c)(1),
(2) Date: May 24, 2016

(87) PCT Pub. No.: WO2015/080062
PCT Pub. Date: Jun. 4, 2015

(65) Prior Publication Data
US 2017/0037313 A1    Feb. 9, 2017

(30) Foreign Application Priority Data

Nov. 29, 2013 (JP) ................... 2013-247200

(51) Int. Cl.
*C09K 11/64* (2006.01)
*C09K 11/80* (2006.01)
(Continued)

(52) U.S. Cl.
CPC ............ *C09K 11/7792* (2013.01); *C09D 5/22* (2013.01); *C09D 17/004* (2013.01);
(Continued)

(58) Field of Classification Search
CPC ............ C09K 11/7734; C09K 11/7792; C09K 11/883; C09D 5/22; C09D 17/00;
(Continued)

(56) References Cited

U.S. PATENT DOCUMENTS 7,611,642 B2 * 11/2009 Takahashi ............. C04B 35/597
252/301.4 F
2007/0018567 A1   1/2007 Hirosaki
(Continued)

FOREIGN PATENT DOCUMENTS

| JP | 2009-167328 | * | 7/2009 |
| JP | 2009167328 A | | 7/2009 |
| JP | A2013-194078 A | | 9/2013 |

OTHER PUBLICATIONS

Translation for JP 2009-167328, Jul. 30, 2009.*
(Continued)

*Primary Examiner* — C Melissa Koslow
(74) *Attorney, Agent, or Firm* — Trojan Law Offices

(57) ABSTRACT

Provided are an oxynitride phosphor comprising a JEM crystal as a main component and being characterized by light-emitting properties (light emission color or excitation property, light emission spectrum) that is different from the known JEM phosphor, and an application thereof. The phosphor of the present invention comprises the JEM crystal activated with Eu and represented by $MAl(Si, Al)_6(O, N)_{10}$ (where the M element is one or more elements selected from the group consisting of Ca, Sr, Eu, La, Sc, Y, and lanthanoid elements; and includes at least Eu as well as Ca and/or Sr).

20 Claims, 8 Drawing Sheets

Excitation and emission spectra of Example 3

(51) Int. Cl.
*C09K 11/08* (2006.01)
*C09K 3/00* (2006.01)
*C09C 1/40* (2006.01)
*G02F 1/13357* (2006.01)
*H01J 11/42* (2012.01)
*H01J 31/12* (2006.01)
*H01J 31/15* (2006.01)
*H01L 33/50* (2010.01)
*H01L 51/50* (2006.01)
*H05B 33/12* (2006.01)
*C09K 11/77* (2006.01)
*H01J 29/20* (2006.01)
*C09D 5/22* (2006.01)
*C09D 17/00* (2006.01)
*H01L 33/56* (2010.01)
*H01L 33/60* (2010.01)
*H01L 33/62* (2010.01)
*G02F 1/1335* (2006.01)
*H01L 27/32* (2006.01)

(52) U.S. Cl.
CPC ...... *C09K 11/0883* (2013.01); *C09K 11/7734* (2013.01); *H01J 11/42* (2013.01); *H01J 29/20* (2013.01); *H01L 33/502* (2013.01); *H01L 33/56* (2013.01); *H01L 33/60* (2013.01); *H01L 33/62* (2013.01); *G02F 1/1336* (2013.01); *G02F 2001/133614* (2013.01); *H01J 2329/20* (2013.01); *H01L 27/322* (2013.01); *H01L 2224/48091* (2013.01); *H01L 2224/48247* (2013.01); *H01L 2224/8592* (2013.01)

(58) Field of Classification Search
CPC ...... H01L 33/502; H01L 33/504; H01J 11/42; H01J 29/20
See application file for complete search history.

(56) References Cited

U.S. PATENT DOCUMENTS

| | | |
|---|---|---|
| 2007/0278930 A1 | 12/2007 | Takahashi et al. |
| 2012/0099291 A1 | 8/2012 | Hirosaki |
| 2013/0207535 A1 | 8/2013 | Hirosaki et al. |
| 2013/0207538 A1 | 8/2013 | Hirosaki et al. |

OTHER PUBLICATIONS

Supplementary European Search Report for Equivalent Application in Europe, European Application No. 1486555.8.
International Search Report for Parent PCT Application PCT/JP2014/080974.

* cited by examiner

Powder XRD pattern of Example 3 (actual measurement)

Powder XRD pattern of Example 6 (actual measurement)

Powder XRD pattern of Example 15 (actual measurement)

Single crystal of comparative example 1

Single crystal of Example 2

Single crystal of Example 4

Excitation and emission spectra of Example 3

Excitation and emission spectra of Example 6

Excitation and emission spectra of Example 15

Object color of Example 3

PHOSPHOR, LIGHT-EMITTING DEVICE, IMAGE DISPLAY DEVICE, PIGMENT, AND ULTRAVIOLET ABSORBER

TECHNICAL FIELD

The present invention relates to a phosphor comprising a JEM crystal activated by Eu, and a light emitting device, an image display device, a pigment, and an ultraviolet absorber utilizing the phosphor.

BACKGROUND ART

The phosphor is utilized in a fluorescent display tube (VFD: vacuum-fluorescent display), a field emission display (FED: Field Emission Display), a SED (Surface-Conduction Electron-Emitter Display), a plasma display panel (PDP: Plasma Display Panel), a cathode-ray tube (CRT: Cathode-Ray Tube), a liquid-crystal display backlight (Liquid-Crystal Display Backlight), a white light-emitting diode (LED: Light-Emitting Diode), and soon. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light.

As an example of such a phosphor, an oxynitride phosphor including a JEM phase as a main component represented by the general formula of $(MAl(Si_{6-z}Al_z)N_{10-z}O_z)$ (here, M is one or two or more kinds of elements selected from the group consisting of La, Ce, Pr, Nd, Sm, Eu, Gd, Tb, Dy, Ho, Er, Tm, Yb, and Lu.) is known (for example, refer to Patent reference 1). According to Patent reference 1, it is disclosed that the oxynitride phosphor including La and Ce as the M element is a phosphor to emit blue light and that the oxynitride phosphor including La and Eu as the M element or the oxynitride phosphor including La and Tb as the M element is a phosphor to emit green light.

Further, an oxynitride phosphor including, as a main component, a JEM phase including an alkaline-earth metal has been developed (for example, refer to Patent reference 2). According to Patent reference 2, it is disclosed that the phosphor is an oxynitride phosphor activated by Ce and including a JEM phase as a main component, in which La is partially replaced with Ca, Sr, or Ba, so as to emit blue to green light having a wavelength of not exceeding 510 nm.

However, the phosphor including the JEM phase as the main component (hereinafter, also referred to as "JEM phosphor"), which has been developed as shown in Patent reference 1 or 2, is a phosphor to emit blue or green light. The emission intensity of the phosphor emitting the green light was low.

PRIOR ART REFERENCES

Patent References

[Patent Reference 1] WO 2005/019376, pamphlet
[Patent Reference 2] Japanese Patent Application Publication No. 2007-326914

Non-Patent Reference

[Non-Patent Reference 1] Jekabs Grins and three others, "Journal of Materials Chemistry", 1995, vol. 5, November, pp. 2001-2006.

SUMMARY OF THE INVENTION

Problem to be Solved by the Invention

It is an object of the present invention to provide an oxynitride phosphor comprising a JEM crystal as a main component and having different emission properties (e.g., emission color or excitation property, and emission spectrum) than those of known JEM phosphors, and an application utilizing the oxynitride phosphor.

Means to Solve the Problem

The present inventors investigated intensively the relationship with emission properties of phosphors in which various kinds of metal elements were added to JEM crystals and, as a result thereof, found that some of them had different emission properties than those of known JEM phosphors by rendering configurations as described below. Further, the present inventors found out that the inorganic phosphor having a specific composition exhibited the emission of green-to-yellow color. The present invention is what has been achieved as a result of a series of investigations based on the above-mentioned finding, whereby an oxynitride phosphor exhibiting high emission brightness, and a light emitting device, an image display device, a pigment, and an ultraviolet absorber, each of which utilizes the phosphor, were successfully provided. The JEM crystal is in particular expected to be excellent in the heat resistance such that the phosphor including the JEM crystal as a host crystal is expected to have a promising application thereof. And an excellent emission property was recognized in a phosphor having a specific composition. That is, such a configuration is described as follows.

A phosphor according to the present invention comprises a JEM crystal activated with Eu which is represented by $MAl(Si, Al)_6(O, N)_{10}$ (where an M element is one or two or more kinds of elements selected from the group consisting of Ca, Sr, Eu, La, Sc, Y, and lanthanoid elements and includes at least Eu and Ca and/or Sr), whereby the above-mentioned problem may be solved.

The above-mentioned phosphor may be represented by $Ca_aSr_bEu_cLa_dSi_eAl_fO_gN_h$ and the parameters: a, b, c, d, e, f, g, and h (where a+b+c+d+e+f+g+h=1) may satisfy the following conditions.

$0.02 \le a+b+d \le 0.06$, $0.0003 \le c \le 0.03$, $0.1 \le e \le 0.5$, $0.02 \le f \le 0.3$, $0.02 \le g \le 0.3$, $0.3 \le h \le 0.6$, and $0 < a+b$.

The above-mentioned JEM crystal activated with Eu may be represented by $((Ca)_t, Eu_u, La_x)AlSi_{6-z}Al_zN_{10-z-t-u}O_{z+t+u}$, $((Sr)_t, Eu_u, La_x)AlSi_{6-z}Al_zN_{10-z-t-u}O_{z+t+u}$, $((Ca, Sr)_t, Eu_u, La_x)AlSi_{6-z}Al_zN_{10-z-t-u}O_{z+t+u}$, and the parameters: t, u, x, and z (where t+u+x=1) may satisfy the following conditions.

$0.3 \le t < 1$, $0.005 \le u \le 0.2$, and $0.5 \le z \le 2$.

The above-mentioned parameter x may satisfy x=0.

The above-mentioned parameter z may satisfy the condition of $0.5 \leq z \leq 1.5$.

The above-mentioned M element may be Sr and Eu; or Sr, La, and Eu and fluorescence having a peak in a wavelength range of at least 495 nm and less than 570 nm may be emitted upon irradiation by an excitation source.

The above-mentioned M element may be Ca and Eu; or Ca, La, and Eu and the atomic fraction of Eu may satisfy the condition of at least 0.003 and not exceeding 0.03 and fluorescence having a peak in a wavelength range of at least 570 nm and not exceeding 590 nm may be emitted upon irradiation by an excitation source.

The above-mentioned M element may be Ca and Eu; or Ca, La, and Eu and the atomic fraction of Eu may satisfy the condition of at least 0.0003 and less than 0.003 and fluorescence having a peak in a wavelength range of at least 495 nm and less than 570 nm may be emitted upon irradiation by an excitation source.

Another crystal phase or an amorphous phase other than the above-mentioned JEM crystal activated with Eu may further be included therein and the content amount of the above-mentioned JEM crystal activated with Eu may be at least 50 mass %.

The light emitting device according to the present invention comprises at least a light-emitting body and a phosphor and the phosphor comprises at least the above-described phosphor, whereby the above-mentioned problem may be solved.

The above-mentioned light-emitting body may be an organic EL light-emitting body (OLED), a semiconductor laser, a laser diode (LD), or a light-emitting diode (LED), which emits light of wavelength from 330 to 495 nm.

The above-mentioned light-emitting device may be a white color light-emitting diode, or an illuminating device including a plurality of white color light-emitting diodes, or a backlight for a liquid-crystal display panel.

The above-mentioned light-emitting body may emit ultraviolet or visible light having a peak wavelength from 300 to 450 nm, and light of a white color or another color other than the white color may be emitted by mixing light of a green color to a yellow color emitted by the above-mentioned phosphor and light having the wavelength of 450 nm or more emitted by another phosphor.

The above-mentioned phosphor may further comprise a blue phosphor to emit light having a peak wavelength of 420 nm to 500 nm by the above-mentioned light-emitting body.

The above-mentioned blue phosphor may be selected from the group consisting of AlN:(Eu, Si), $BaMgAl_{10}O_{17}$:Eu, $SrSi_9Al_{19}ON_{31}$:Eu, $LaSi_9Al_{19}N_{32}$:Eu, α-sialon:Ce, and JEM:Ce.

The above-mentioned phosphor may further comprise a green phosphor to emit light having a peak wavelength of at least 500 nm and not exceeding 550 nm by the light-emitting body.

The above-mentioned green phosphor may be selected from the group consisting of μ-sialon:Eu, (Ba, Sr, Ca, Mg)$_2$SiO$_4$:Eu, and (Ca, Sr, Ba)Si$_2$O$_2$N$_2$:Eu.

The above-mentioned phosphor may further comprise a yellow phosphor to emit light having a peak wavelength of at least 550 nm and not exceeding 600 nm by the above-mentioned light-emitting body.

The above-mentioned yellow phosphor may be selected from the group consisting of YAG:Ce, α-sialon:Eu, CaAlSiN$_3$:Ce, and La$_3$Si$_6$N$_{11}$:Ce.

The above-mentioned phosphor may further comprise a red phosphor to emit light having a peak wavelength of at least 600 nm and not exceeding 700 nm by the light-emitting body.

The above-mentioned red phosphor may be selected from the group consisting of CaAlSiN$_3$:Eu, (Ca, Sr)AlSiN$_3$:Eu, Ca$_2$Si$_5$N$_3$:Eu, and Sr$_2$Si$_5$N$_3$:Eu.

The above-mentioned light-emitting body may be an LED to emit light of wavelength of 320 to 450 nm.

An image display device according to the present invention comprises at least an excitation source and a phosphor and the phosphor comprises at least the above-described phosphor, whereby the above-mentioned problem may be solved.

The image display device may be any of a liquid crystal display (LCD), a fluorescent display tube (VFD), a field emission display (FED), a plasma display panel (PDP), and a cathode-ray tube (CRT).

A pigment according to the present invention comprises the above-mentioned JEM crystal activated with Eu.

An ultraviolet absorber according to the present invention comprises the above-mentioned JEM crystal activated with Eu.

Effect of the Invention

A phosphor according to the present invention includes, as a main component, a JEM crystal activated with Eu, which is represented by MAl(Si, Al)$_6$(O, N)$_{10}$ (where the M element is one or two or more kinds of elements selected from the group consisting of Ca, Sr, Eu, La, Sc, Y, and lanthanoid elements and includes at least Eu and Ca and/or Sr so as to become a phosphor having different emission characteristics than those of the conventional JEM phosphor. The phosphor of a specific composition is excellent as a phosphor to emit light of a green color to a yellow color. The above-mentioned phosphor may comprise at least Ca or Sr. That is, it can be characterized by including, as a main component, a JEM crystal having only Ca (in the above-described general formula, a>0 and b=0), a JEM crystal having only Sr (in the above-described general formula, b>0 and a=0), or a JEM crystal having Ca and Sr (in the above-described general formula, a>0 and b>0). And the JEM crystal activated with Eu may include at least Eu (in the above-described general formula, c>0).

And in the case where the JEM crystal activated with Eu is represented by ((Ca)$_t$, Eu$_u$, La$_x$)AlSi$_{6-z}$Al$_z$N$_{10-z-t-u}$O$_{z+t+u}$, ((Sr)$_t$, Eu$_u$, La$_x$)AlSi$_{6-z}$Al$_z$N$_{10-z-t-u}$O$_{z+t+u}$, or ((Ca, Sr)$_t$, Eu$_u$, La$_x$)AlSi$_{6-z}$Al$_z$N$_{10-z-t-u}$O$_{z+t+u}$ and the parameters: t, u, x, and z (where it is assumed t+u+x=1) satisfy the following condition:

$$0.3 \leq t < 1,$$

$$0.005 \leq u \leq 0.2, \text{ and}$$

$$0.5 \leq z \leq 2.$$

Here, although it is the common technical knowledge for one of skill in the art, all the above-mentioned parameters are figures having values of at least zero (0) and, since t and u satisfy the above-described conditions, the x satisfies "$0 \leq x \leq 0.695$".

A phosphor according to the present invention is also less likely subject to material degradation or brightness deterioration even if exposed to the excitation source. Therefore, the phosphor is suitable for applications such as VFD, FED, PDP, CRT, LCD, and white LED. The phosphor of the present invention absorbs an ultraviolet ray, and thus the phosphor is suitable for a pigment and an ultraviolet absorber.

EMBODIMENT FOR CARRYING OUT THE INVENTION

Figure 1:
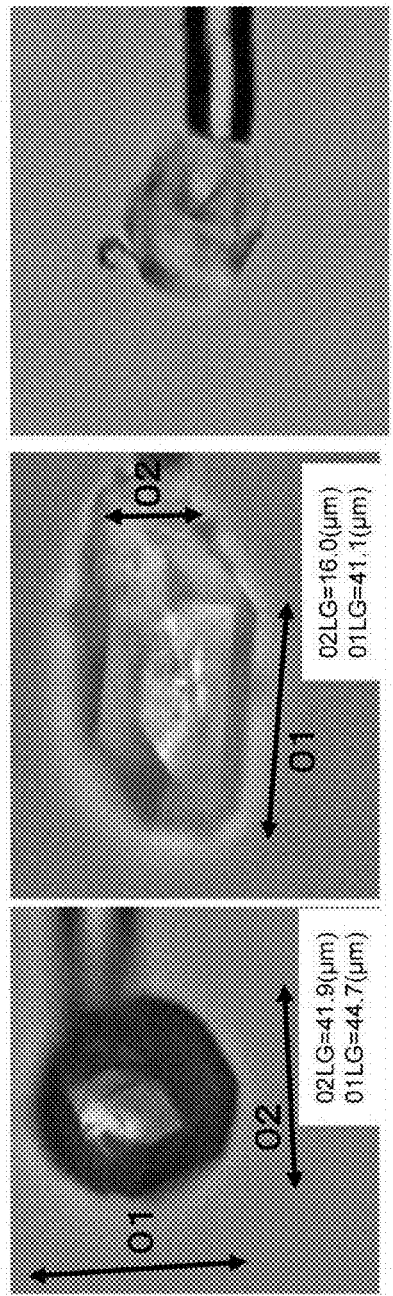
FIG. 1 is a diagram showing observation results of crystal particles of Comparative Example 1, Example 2, and Example 4.

The present inventors focused on the JEM crystal constituting an existing JEM phosphor and found out a phosphor comprising, as a main component, a JEM crystal activated with Eu, which is represented by $MAl(Si, Al)_6(O, N)_{10}$ (where the M element is one or two or more kinds of elements selected from the group consisting of Ca, Sr, Eu, La, Sc, Y, and lanthanoid elements and includes at least Eu and Ca and/or Sr).

In the present invention, it is desirable that the phosphor contains a JEM phase (a JEM crystal) crystal of as high purity as possible and it is even more desirable that the phosphor comprises a single phase thereof from the viewpoint of the fluorescence emission, but it is possible for the phosphor to comprise a mixture of the same with other crystalline phases or amorphous phases within a range where characteristics thereof are not deteriorated. In this case, it is desirable that the content amount of the JEM phase is 50 mass % or more in order to obtain the high brightness thereof. In the present invention, it is desirable that the content amount of the JEM phase is at least 50 mass % as a range of the main component. Here, the content ratio of the JEM crystal may be obtained from a ratio of strongest peak of each phase in the X-ray diffraction pattern after conducting the X-ray diffraction measurement. In the case where there are phosphors as a mixture, it is possible to assume the composition of the mixture of phosphors as a whole in consideration of content amounts of JEM phases therein. That is, content percentages of the JEM phases in respective phosphors are specified by a method as mentioned above, and compositions of the respective phosphors with respect to the phases are weighted and summed up, whereby the composition of the mixture phosphor having the JEM phase as the main component may be obtained. If the content of the JEM phase in the mixture phosphor is at least 50 mass %, even though it is a mixture of phosphors, it is also included in the phosphor according to the present invention.

While the conventional JEM phase as disclosed in Patent reference 1 and so on has often been represented by $MAl(Si_{6-z}Al_z) N_{10-z}O_z$ (where M is a lanthanoid element such as La and Ce), in the present invention, it was found that a divalent metal ion such as Ca and Sr could replace La such that it may be represented by $MAl(Si, Al)_6(O, N)_{10}$. This is because the total number of Si and Al and the total number of O and N should not be changed in the JEM crystal in order to maintain the crystal even if such a replacement occurs. Here, if an element having a different valence other than two is used for M, the valence of M as a whole is changed. In such a case, the ratio of Si/Al or the ratio of O/N may be changed in order to maintain the electrical neutrality.

Here, the JEM crystal (JEM phase) represented by the above-described general formula: $MAl(Si_{6-z}Al_z) N_{10-z}O_z$ is substance that was confirmed to be produced through the process of preparing α-sialon stabilized with a rare earth metal by Jekabs Grins, et al. and crystal structure parameters as shown in Table 1 were reported (for example, Nonpatent reference 1).

TABLE 1

Structure parameters of JEM phase

| | Atom | Site | Coordinate (x) | Coordinate (y) | Coordinate (z) |
|---|---|---|---|---|---|
| (1) | La | 8d | 0.0553 | 0.0961 | 0.1824 |
| (2) | Al | 4c | 0 | 0.427 | 0.25 |
| (3) | M(1) | 8d | 0.434 | 0.185 | 0.057 |
| (4) | M(2) | 8d | 0.27 | 0.082 | 0.52 |
| (5) | M(3) | 8d | 0.293 | 0.333 | 0.337 |
| (6) | X(1) | 8d | 0.344 | 0.32 | 0.14 |
| (7) | X(2) | 8d | 0.383 | 0.21 | 0.438 |
| (8) | X(3) | 8d | 0.34 | 0.485 | 0.41 |
| (9) | X(4) | 8d | 0.11 | 0.314 | 0.363 |
| (10) | X(5) | 8d | 0.119 | 0.523 | 0.127 |

That is, the JEM phase as shown in Table 1 is substance characterized by (1) specific Pbcn space group (space group), (2) lattice constants (a=9.4225 Å, b=9.7561 Å, and c=8.9362 Å), and (3) specific atomic sites and atomic coordinates. Although the lattice constants in Table 1 could change as the amount of solid solution of La, Al, M (Si and Al), and X changes, (1) the crystal structure indicated by the Pbcn space group and (2) the site which is occupied by the atom and the atomic coordinates of the site would not change. In Table 1, each of the coordinates of x, y, and z should be a value from 0 to 1 with respect to the lattice.

If these basic data are given as described in Table 1, the crystal structure of the substance is unambiguously determined by the data and the X-ray diffraction intensities (X-ray diffraction chart) that the crystal structure should have can be calculated based on the data. And if the measured X-ray diffraction result matches the calculated diffraction data, the crystal structures can be identified to be the same.

In the JEM crystal activated with Eu according to the present invention, as shown in Table 1, an M element including Eu and Ca and/or Sr occupies at least a site of La in accordance with respective probabilities of compositional ratios thereof; Si and Al occupy sites of M(1) to M(3) in accordance with respective probabilities of compositional ratios thereof; and N and O occupy sites of X(1) to X(5) in accordance with respective probabilities of compositional ratios thereof.

A phosphor according to the present invention is preferably represented by a compositional formula of $Ca_aSr_bEu_cLa_dSi_eAl_fO_gN_h$ and parameters of a, b, c, d, e, f, g, and h (where a+b+c+d+e+f+g+h=1) satisfy the following conditions:

$0.02 \leq a+b+d \leq 0.06$, $0.0003 \leq c \leq 0.03$, $0.1 \leq e \leq 0.5$, $0.02 \leq f \leq 0.3$, $0.02 \leq g \leq 0.3$, $0.3 \leq h \leq 0.6$, and $0 < a+b$.

Hence, the JEM phase activated with Eu is included as the main component such that the phosphor characterized by high emission intensity can be obtained.

The parameters of a, b, and d relate to main metals occupying sites of the M atom in the crystal represented by $MAl(Si, Al)_6(O, N)_{10}$ and if a+b+d is less than 0.02 or more than 0.06, then it may become difficult to maintain the crystal structure so as to lower the emission intensity. However, even if a+b+d is at least 0.01, a similar crystal structure might be able to be maintained and, particularly depending on the ambient environment, it could be maintained even if a+b+d is at least 0.005. Further, even if a+b+d is not exceeding 0.07, a similar crystal structure might be able to be maintained and, particularly depending on the ambient environment, it could be maintained even if a+b+d is not exceeding 0.08.

The parameter c indicates an additive amount of Eu to become a luminescence center and if c is less than 0.0003, the amount of luminescence center would be so little that the emission intensity might be lowered. And if it is more than 0.03, the concentration quenching in which energy dissipates among luminescence centers might occur such that the emission intensity might be lowered. However, even if c is at least 0.0002, the emission intensity might be maintained to some extent and, particularly depending on the ambient environment, it could be maintained even if c is at least 0.0001. Further, even if c is not exceeding 0.004, comparable emission intensity might be maintained to some extent and, particularly depending on the ambient environment, it could be maintained even if c is at least 0.005.

The parameter e indicates an additive amount of Si to form a skeleton of the crystal and if the amount is less than 0.1 or more than 0.5, it would be so hard to maintain the crystal structure that the emission intensity might be lowered.

The parameter f indicates an additive amount of Al to form a skeleton of the crystal and if the amount is less than 0.02 or more than 0.3, it would be so hard to maintain the crystal structure that the emission intensity might be lowered.

The parameter g indicates an additive amount of oxygen to form a skeleton of the crystal and if the amount is less than 0.02 or more than 0.3, it would be so hard to maintain the crystal structure that the emission intensity might be lowered.

The parameter h indicates an additive amount of nitrogen to form a skeleton of the crystal and if the amount is less than 0.3 or more than 0.6, it would be so hard to maintain the crystal structure that the emission intensity might be lowered.

More preferably, the parameters e, f, g, and h satisfy, respectively, the following conditions:

$0.25 \leq e \leq 0.3$, $0.1 \leq f \leq 0.15$, $0.08 \leq g \leq 0.15$, and $0.4 \leq h \leq 0.5$.

Thus, the phosphor of the present invention surely renders green color to yellow color emission.

Here, the above-mentioned parameters of a to h may be selected from the above-mentioned range as the general formula $MAl(Si, Al)_6(O, N)_{10}$ may be satisfied.

The JEM crystal activated with the above-mentioned Eu according to the present invention is preferably represented by $((Ca)_t, Eu_u, La_x)AlSi_{6-z}Al_zN_{10-z-t-u}O_{z+t+u}$, $((Sr)_t, Eu_u, La_x)AlSi_{6-z}Al_zN_{10-z-t-u}O_{z+t+u}$, or $((Ca, Sr)_t, Eu_u, La_x)AlSi_{6-z}Al_zN_{10-z-t-u}O_{z+t+u}$, and the parameters of t, u, x, and z (where t+u+x=1) satisfy the following conditions:

$0.3 \leq t < 1$, $0.005 \leq u \leq 0.2$, and $0.5 \leq z \leq 2$.

Thus, the phosphor characterized by high emission intensity might be particularly obtained.

The above-mentioned formula indicates a composition in which the emission characteristics may be effectively improved as well as a stable crystal thereof can be obtained in the JEM crystal including divalent Ca, Sr, and Eu ions; and trivalent La ion.

The parameter t indicates a content amount of divalent ions of Ca and Sr and it can include a value to be determined by the condition of t+u+x=1.

The parameter x indicates a content amount of a trivalent ion of La and it can include a value to be determined by the condition of t+u+x=1. Further, it is OK if the trivalent ion is not included (it is OK even if x=0).

In the present invention, Eu can be utilized as the luminescence center and the range that satisfies the condition of $0.005 \leq u \leq 0.2$ can be employed. If the total amount is less than 0.005, then the concentration of ion that performs the emission is so low that the emission intensity is lowered. And if the total amount is more than 0.2, the emission intensity may be lowered due to the interaction between luminescence center ions (concentration quenching).

The parameter z is a value to determine the ratio of Si and Al. In the crystal structure, there is one designated position of Al and there are 6 positions which either Si or Al can occupy. By changing the parameter z, it is possible to change the ratio of Si and Al that occupy 6 positions in the crystal as the crystal structure is being maintained. It is preferable for z to have a value of at least 0.5 and not more than 2. If it is less than 0.5 or more than 2, the stability of the crystal structure is lowered such that the emission intensity is lowered. In particular, the emission intensity is high if the value of z is at least 0.5 and not exceeding 1.5 since a stable crystal can be obtained.

There are 10 positions which can be occupied by either O or N in the crystal structure. If the parameter of N is $10-z-t-u$ and the parameter of O is $z+t+u$ based on the condition of electrical neutrality, the crystal structure may be stabilized such that the emission intensity may become high.

In $((Ca)_t, Eu_u, La_x)AlSi_{6-z}Al_zN_{10-z-t-u}O_{z+t+u}$, $((Sr)_t, Eu_u, La_x)AlSi_{6-z}Al_zN_{10-z-t-u}O_{z+t+u}$, and $((Ca, Sr)_t, Eu_u, La_x)AlSi_{6-z} Al_zN_{10-z-t-u}O_{z+t+u}$, if the parameter x satisfies x=0, $((Ca)_t, Eu_u)AlSi_{6-z}Al_zN_{10-z-t-u}O_{z+t+u}$, $((Sr)_t, Eu_u)AlSi_{6-z}Al_zN_{10-z-t-u}O_{z+t+u}$, and $((Ca, Sr)_t, Eu_u)AlSi_{6-z}Al_zN_{10-z-t-u}O_{z+t+u}$ are characterized in that crystal structures thereof would be stable and the emission intensities thereof would be high.

In $((Ca)_t, Eu_u, La_x)AlSi_{6-z}Al_zN_{10-z-t-u}O_{z+t+u}$, $((Sr)_t, Eu_u, La_x)AlSi_{6-z}Al_zN_{10-z-t-u}O_{z+t+u}$, and $((Ca, Sr)_t, Eu_u, La_x)AlSi_{6-z} Al_zN_{10-z-t-u}O_{z+t+u}$, if the parameter z satisfies the condition of $0.5 \leq z \leq 1.5$, crystal structures thereof would be stable and emission intensities thereof would be high.

According to the present invention, it is possible to obtain a phosphor, by selecting the composition thereof, which is characterized in that the maximum emission wavelength of the fluorescent spectrum thereof is at least 495 nm and not exceeding 590 nm and that the maximum excitation wavelength of the excitation spectrum thereof is at least 320 nm and not exceeding 460 nm. Such a phosphor can be utilized as a green or a yellow color phosphor for violet or blue excitation.

For example, a phosphor comprising a JEM crystal as a main component which is represented by the above-described $MAl(Si, Al)_6(O, N)_{10}$ activated with Eu wherein the M element is Sr and Eu; or Sr, La, and Eu can emit fluorescence of a green color having a peak in a wavelength range of at least 495 nm and less than 570 nm upon irradiation by an excitation source. Preferably, the JEM crystal activated with Eu is represented by $((Sr)_t, Eu_u, La_x)AlSi_{6-z}Al_zN_{10-z-t-u}O_{z+t+u}$ (where t+u+x=1, t satisfies $0.3 \leq t \leq 0.9$, u satisfies $0.005 \leq u \leq 0.2$, z satisfies $0.5 \leq z \leq 2$, and x satisfies $0 \leq x$.).

For example, a phosphor comprising a JEM crystal as a main component which is represented by the above-described $MAl(Si, Al)_6(O, N)_{10}$ activated with Eu wherein the M element is Ca and Eu; or Ca, La, and Eu can emit fluorescence of green-to-yellow color having a peak in a wavelength range of at least 495 nm and not exceeding 590 nm upon irradiation by an excitation source.

More specifically, if the atomic fraction of Eu is at least 0.0003 and less than 0.003 (for example, $0.0003 \leq c < 0.003$ in the above-mentioned composition formula: $Ca_aSr_bEu_cLa_dSi_eAl_fO_gN_h$), the phosphor may emit fluorescence of green color having a peak in a wavelength range of at least 495 nm and less than 570 nm. Preferably, the JEM crystal activated with Eu is represented by $((Ca)_t, Eu_u, La_x)AlSi_{6-z}Al_zN_{10-z-t-u}O_{z+t+u}$ (where t+u+x=1, t satisfies $0.3 \leq t \leq 0.9$, u satisfies $0.005 \leq u < 0.06$, z satisfies $0.5 \leq z \leq 2$, and x satisfies $0 \leq x$.).

Further, if the atomic fraction of Eu is at least 0.003 and not exceeding 0.03 (for example, $0.003 \leq c \leq 0.03$ in the above-mentioned composition formula: $Ca_aSr_bEu_cLa_dSi_eAl_fO_gN_h$), the phosphor may emit fluorescence of yellow color having a peak in a wavelength range of at least 570 nm and not exceeding 590 nm. Preferably, the JEM crystal activated with Eu is represented by $((Ca)_t, Eu_u, La_x)AlSi_{6-z}Al_zN_{10-z-t-u}O_{z+t+u}$ (where t+u+x=1, t satisfies $0.3 \leq t \leq 0.9$, u satisfies $0.06 \leq u \leq 0.2$, z satisfies $0.5 \leq z \leq 2$, and x satisfies $0 \leq x$.).

It is possible to provide the electrical conductivity to the phosphor of the present invention by mixing inorganic substances having the electrical conductivity into the phosphor if the phosphor is applied to the field where the phosphor is excited by an electron beam. As the inorganic substance having the electrical conductivity, oxide, oxynitride, nitride, or a combination thereof, which include one or two or more kinds of elements selected from Zn, Al, Ga, In, and Sn, can be referred to.

Since the brightness of the phosphor of the present invention does not decrease only a little even when exposed to the excitation source, it is an oxynitride phosphor suitably used for VFD, FED, PDP, CRT, LCD, white LED and so on.

Further, the phosphor of the present invention absorbs a ultraviolet ray so as to be effective for a pigment or an ultraviolet absorber. The phosphor of the present invention is also applicable to the pigment since it has a yellow object color.

A method of manufacturing such a phosphor of the present invention is not particularly limited, but, for example, a mixture of metal compounds being a raw material mixture that can constitute the phosphor of the JEM crystal is fired in a nitrogen-containing inert atmosphere in the temperature range of 1,200° C. or higher and 2,200° C. or lower so as to obtain the phosphor.

More specifically, powders of compounds including respective desired elements (for example, silicon nitride ($Si_3N_4$), aluminum nitride (AlN), aluminum oxide ($Al_2O_3$), calcium oxide (CaO), strontium oxide (SrO), lanthanum nitride (LaN), lanthanum oxide ($La_2O_3$), europium oxide ($Eu_2O_3$), and so on) are weighed and mixed to be the desired rates of elements. The mixed powders are put into a crucible made of boron nitride and the loaded crucible is set into an electric furnace of a graphite resistive heating type. The inside of the electric furnace is evacuated by a diffusion pump, the temperature is raised from a room temperature (for example, 800° C.), a nitrogen gas of high purity (for example, 99.999 vol % purity) is introduced into the electric furnace, and the pressure inside the electric furnace is made to be constant (for example, 1 MPa). Then, the temperature inside the electric furnace is further raised (for example, at least 1200° C. and not exceeding 2200° C.) and should be kept for a certain time (for example, 2 hours). In this way, it is possible to obtain a phosphor comprising a JEM crystal activated with Eu according to the present invention.

The light-emitting device of the present invention is configured by using at least a light-emitting body or an emission source, and the phosphor of the present invention.

As the light-emitting body or the emission source, there are an light-emitting diode (LED) light-emitting instrument, a laser diode (LD) light-emitting instrument, a semiconductor laser, an organic EL (OLED) light-emitting instrument, a fluorescent lamp, and so on. The LED light-emitting device can be manufactured using the phosphor of the present invention and by a publicly known method which is described in Japanese Patent Application Publication No. H05(1993)-152609, Japanese Patent Application Publication No. H07(1995)-99345, Japanese Patent No. 2927279, and so on. In this case, the light-emitting body or the emission source is preferably what emits light of a wavelength from 330 to 495 nm. In particular, an LED light-emitting element emitting an ultraviolet (or violet) ray of a wavelength from 330 to 420 nm, or an LED light-emitting element emitting blue light in a wavelength from 420 to 495 nm is preferable. Such LED light-emitting elements may include a nitride semiconductor such as GaN or InGaN, which can be an emission source of a predetermined wavelength by adjusting the composition.

As a light-emitting device of the present invention, there are a white light-emitting diode, an illuminating device including a plurality of white light-emitting diodes, a backlight for a liquid crystal panel, and the like, which include the phosphor of the present invention, respectively.

In such light-emitting devices, in addition to the phosphor of the present invention, the device may further include one or two or more kinds of phosphors selected from β-sialon green phosphor activated with Eu, α-sialon yellow phosphor activated with Eu, $Sr_2Si_5N_8$ orange phosphor activated with Eu, (Ca, Sr)$AlSiN_8$ orange phosphor activated with Eu, and $CaAlSiN_8$ red phosphor activated with Eu. As the yellow phosphor other than the above, for example, YAG:Ce, (Ca, Sr, Ba)$Si_2O_2N_2$:Eu, and the like may be used.

As one aspect of the light-emitting device of the present invention, there is a light-emitting device in which a light-emitting body or an emission source emits ultraviolet light or visible light having a peak wavelength of 300 to 450 nm such that the phosphor of the present invention emits light of green-to-yellow color, which is mixed with light having a wavelength of 450 nm or more emitted by the other phosphor of the present invention such that the light-emitting device emits light of a white color or light of another color other than the white color.

As one aspect of the light-emitting device of the present invention, in addition to the phosphor of the present invention, a blue phosphor emitting light having a peak wavelength of at least 420 nm and not exceeding 500 nm by means of the light-emitting body or the emission source can further be included. As examples of such a blue phosphor, there are AlN:(Eu, Si), $BaMgAl_{10}O_{17}$:Eu, $SrSi_9Al_{19}O_{31}$:Eu, $LaSi_9Al_{19}N_{32}$:Eu, α-sialon:Ce, JEM:Ce, and so on.

As one aspect of the light-emitting device of the present invention, in addition to the phosphor of the present invention, a green phosphor emitting light having a peak wavelength of at least 500 nm and not exceeding 550 nm by means of the light-emitting body or the emission source can further be included. As examples of such a green phosphor, there are β-sialon:Eu, (Ba, Sr, Ca, Mg)$_2SiO_4$:Eu, (Ca, Sr, Ba)$Si_2O_2N_2$:Eu, and so on.

As one aspect of the light-emitting device of the present invention, in addition to the phosphor of the present invention, a yellow phosphor emitting light having a peak wavelength of at least 550 nm and not exceeding 600 nm by means of the light-emitting body or the emission source can further be included. As examples of such a yellow phosphor, there are YAG:Ce, α-sialon:Eu, $CaAlSiN_3$:Ce, $La_3Si_6N_{11}$:Ce, and so on.

As one aspect of the light-emitting device of the present invention, in addition to the phosphor of the present invention, a red phosphor emitting light having a peak wavelength of at least 600 nm and not exceeding 700 nm by means of the light-emitting body or the emission source can further be included. As examples of such a red phosphor, there are $CaAlSiN_3$:Eu, (Ca, Sr)$AlSiN_3$:Eu, $Ca_2Si_5N_8$:Eu, $Sr_2Si_5N_8$:Eu, and so on.

For example, if a phosphor of the present invention emits light of a green color, there is a combination of a light-emitting body or an emission source emitting ultraviolet light having a peak wavelength of 300 to 420 nm, a blue phosphor emitting light having a peak wavelength of at least 420 nm and not exceeding 500 nm upon excitation of the ultraviolet light of the above-mentioned wavelength, a red phosphor emitting light having a peak wavelength of at least 600 nm and not exceeding 700 nm, and the green phosphor of the present invention. In such a configuration, if the ultraviolet light emitted by the light-emitting body or an emission source irradiates the phosphors, light of three colors: red, green, and blue is emitted so as to produce a white color lighting device by mixing these three colors.

For example, if a phosphor of the present invention emits light of a green color, there is a combination of a light-emitting body or an emission source emitting blue light having a peak wavelength from 420 to 490 nm, a red phosphor emitting light having a peak wavelength of at least 600 nm and not exceeding 700 nm upon excitation of the blue light of the above-mentioned wavelength, and the green phosphor of the present invention. In such a configuration, if the blue light emitted by the light-emitting body or the emission source irradiates the phosphors, light of two colors: red and green is emitted so as to produce a white color lighting device by mixing light of these colors and blue light of the light-emitting body or an emission source itself.

For example, if a phosphor of the present invention emits light of a yellow color, there is a combination of a light-emitting body or an emission source emitting blue light having a peak wavelength from 420 to 490 nm, a red phosphor emitting light having a peak wavelength of at least 600 nm and not exceeding 700 nm upon excitation of the blue light of the above-mentioned wavelength, and the yellow phosphor of the present invention. In such a configuration, if the blue light emitted by the light-emitting body or the emission source irradiates the phosphors, light of two colors: red and yellow is emitted so as to produce a white color lighting device by mixing light of these colors and blue light of the light-emitting body or the emission source itself.

For example, if a phosphor of the present invention emitting light of a green color and another phosphor of the present invention emitting light of a yellow color are used, there is a combination of a light-emitting body or an emission source emitting blue light having a peak wavelength from 420 to 490 nm, the green phosphor of the present invention, and the yellow phosphor of the present invention. In such a configuration, if the blue light emitted by the light-emitting body or the emission source irradiates the phosphors, light of two colors: green and yellow is emitted so as to produce a white color lighting device by mixing light of these colors and blue light of the light-emitting body or the emission source itself.

It should be understood that the color tone such as reddish incandescent color and bluish white light could be adjusted. Further, concrete examples of the red phosphor or the blue phosphor are described above.

As one aspect of the light-emitting device of the present invention, a light-emitting device with high efficiency can be configured since the emission efficiency is high if an LED in which the light-emitting body or the emission source emits light having a wavelength of 320 to 450 nm is used.

The image display device of the present invention is constituted of at least an excitation source and a phosphor of the present invention and includes a liquid crystal display (LCD), a fluorescent display tube (VFD), a field emission display (FED), a plasma display panel (PDP), a cathode-ray tube (CRT), and so on. It has been confirmed that the phosphor of the present invention emits light by excitation of a vacuum ultraviolet ray of 100 to 190 nm, an ultraviolet ray of 190 to 380 nm, an electron beam, or the like, and the above image display device can be configured by combining these excitation sources and the phosphor of the present invention.

A phosphor of the present invention comprising, as a main component, a JEM crystal having a specific chemical composition has a yellow color as an object color, and thus can be used as a pigment or fluorescent pigment. That is, the object color of yellow is observed when the phosphor of the present invention is irradiated with sunlight or light from a fluorescent lamp or the like, and, in view of a good coloring and no degradation over a long period of time, the phosphor of the present invention is suitable for an inorganic pigment. Therefore, if the phosphor of the present invention is used for a paint, ink, color, glaze, colorant to be added to a plastic product, or the like, a favorable coloring can be maintained at a high level for a long period of time.

A phosphor of the present invention absorbs an ultraviolet ray so as to be suitable also as the ultraviolet absorber. Thus, if the phosphor of the present invention is used as the paint or applied onto a surface of the plastic product or kneaded into an inside thereof, a shielding effect thereof against the ultraviolet ray is so high that the product may be effectively protected from the ultraviolet degradation.

EXAMPLE

The present invention is described in more detail with examples to be shown below. However, these examples are disclosed only to facilitate the understanding of the present invention with ease. Therefore, the present invention is not limited to these examples.
[Raw Materials Used for Synthesis]

The raw material powders used for the synthesis were: silicon nitride powder with a particle size of specific surface area of 11.2 m$^2$/g, oxygen content of 1.29 wt %, and a (alpha) type content of 95% (SN-E10 grade made by Ube Industries, Ltd.); aluminum nitride powder with a particle size of specific surface area of 3.3 m$^2$/g and oxygen content of 0.82 wt % (E grade made by Tokuyama Corporation); aluminum oxide powder with a particle size of specific surface area of 13.2 m$^2$/g (TAIMICRON made by Daimei Chemicals Co., Ltd.); calcium oxide powder (made by Kojundo Chemical Laboratory Co., Ltd.); strontium oxide powder (made by Kojundo Chemical Laboratory Co., Ltd.); lanthanum nitride (KaN; made by Kojundo Chemical Laboratory Co., Ltd.); lanthanum oxide powder (La$_2$O$_3$; made by Kojundo Chemical Laboratory Co., Ltd.); and europium oxide powder (Eu$_2$O$_3$; with purity of 99.9% made by Shin-Etsu Chemical Co., Ltd.).

Phosphor Examples and Comparative Example; Examples 1 to 17

According to the design compositions as shown in Tables 2 and 3, raw materials were weighed to be mixture compositions (mass ratios) as shown in Table 4. Weighed raw material powders were mixed for 5 minutes using a pestle and a mortar made of silicon nitride sintered body. Then, the powder mixture was fed into a crucible made of boron nitride sintered body. A bulk density of the powder body was approximately from 20% to 30%.

The crucible containing the powder mixture was set into an electric furnace of a graphite resistive heating type. In the firing operation, first the firing atmosphere was made vacuum of 1×10$^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised at a rate of 500° C. per hour up to each preset temperature as shown in Table 5, and then the temperature was maintained for two (2) hours. Comparative example 1 and Examples 2 and 4 among the thus-obtained synthesized compounds were observed with an optical microscope. The observation results are shown in FIG. 1.

TABLE 2

Design compositions (atomic ratios) in examples and comparative example

| Example | | | t | x | | 6 − z | Z + 1 | Z + t + u | 10 − z − t − u |
|---|---|---|---|---|---|---|---|---|---|
| | | | u | Ca | Sr | La | Si | Al | O | N |
| Comparative example | 1 | Eu | 0.25 | | | 0.75 | 5.8 | 1.2 | 0.45 | 9.55 |
| Example | 2 | Eu | 0.1 | | 0.9 | | 4.8 | 2.2 | 2.2 | 7.8 |
| Example | 3 | Eu | 0.1 | | 0.4 | 0.5 | 5 | 2 | 1.5 | 8.5 |
| Example | 4 | Eu | 0.5 | 0.5 | | | 5 | 2 | 2 | 8 |
| Example | 5 | Eu | 0.01 | 0.49 | | 0.5 | 5 | 2 | 1.5 | 8.5 |
| Example | 6 | Eu | 0.02 | 0.48 | | 0.5 | 5 | 2 | 1.5 | 8.5 |
| Example | 7 | Eu | 0.03 | 0.47 | | 0.5 | 5 | 2 | 1.5 | 8.5 |
| Example | 8 | Eu | 0.04 | 0.46 | | 0.5 | 5 | 2 | 1.5 | 8.5 |
| Example | 9 | Eu | 0.05 | 0.45 | | 0.5 | 5 | 2 | 1.5 | 8.5 |
| Example | 10 | Eu | 0.06 | 0.44 | | 0.5 | 5 | 2 | 1.5 | 8.5 |
| Example | 11 | Eu | 0.07 | 0.43 | | 0.5 | 5 | 2 | 1.5 | 8.5 |
| Example | 12 | Eu | 0.08 | 0.42 | | 0.5 | 5 | 2 | 1.5 | 8.5 |
| Example | 13 | Eu | 0.09 | 0.41 | | 0.5 | 5 | 2 | 1.5 | 8.5 |
| Example | 14 | Eu | 0.1 | 0.4 | | 0.5 | 5 | 2 | 1.5 | 8.5 |
| Example | 15 | Eu | 0.1 | 0.4 | | 0.5 | 5 | 2 | 1.5 | 8.5 |
| Example | 16 | Eu | 0.1 | 0.4 | | 0.5 | 5 | 2 | 1.5 | 8.5 |
| Example | 17 | Eu | 0.2 | 0.3 | | 0.5 | 5 | 2 | 1.5 | 8.5 |

TABLE 3

Design compositions parameters in examples and comparative example

| Example | | c | a Ca | b Sr | d La | e Si | f Al | g O | h N |
|---|---|---|---|---|---|---|---|---|---|
| Comparative example | 1 | Eu 0.013889 | | | 0.041667 | 0.322222 | 0.066667 | 0.025 | 0.530556 |
| Example | 2 | Eu 0.005556 | | 0.05 | | 0.266667 | 0.122222 | 0.122222 | 0.433333 |
| Example | 3 | Eu 0.005556 | | 0.022222 | 0.027778 | 0.277778 | 0.111111 | 0.083333 | 0.472222 |
| Example | 4 | Eu 0.027778 | 0.027778 | | | 0.277778 | 0.111111 | 0.111111 | 0.444444 |
| Example | 5 | Eu 0.000556 | 0.027222 | | 0.027778 | 0.277778 | 0.111111 | 0.083333 | 0.472222 |
| Example | 6 | Eu 0.001111 | 0.026667 | | 0.027778 | 0.277778 | 0.111111 | 0.083333 | 0.472222 |
| Example | 7 | Eu 0.001667 | 0.026111 | | 0.027778 | 0.277778 | 0.111111 | 0.083333 | 0.472222 |
| Example | 8 | Eu 0.002222 | 0.025556 | | 0.027778 | 0.277778 | 0.111111 | 0.083333 | 0.472222 |
| Example | 9 | Eu 0.002778 | 0.025 | | 0.027778 | 0.277778 | 0.111111 | 0.083333 | 0.472222 |
| Example | 10 | Eu 0.003333 | 0.024444 | | 0.027778 | 0.277778 | 0.111111 | 0.083333 | 0.472222 |
| Example | 11 | Eu 0.003889 | 0.023889 | | 0.027778 | 0.277778 | 0.111111 | 0.083333 | 0.472222 |
| Example | 12 | Eu 0.004444 | 0.023333 | | 0.027778 | 0.277778 | 0.111111 | 0.083333 | 0.472222 |
| Example | 13 | Eu 0.005 | 0.022778 | | 0.027778 | 0.277778 | 0.111111 | 0.083333 | 0.472222 |
| Example | 14 | Eu 0.005556 | 0.022222 | | 0.027778 | 0.277778 | 0.111111 | 0.083333 | 0.472222 |
| Example | 15 | Eu 0.005556 | 0.022222 | | 0.027778 | 0.277778 | 0.111111 | 0.083333 | 0.472222 |
| Example | 16 | Eu 0.005556 | 0.022222 | | 0.027778 | 0.277778 | 0.111111 | 0.083333 | 0.472222 |
| Example | 17 | Eu 0.011111 | 0.016667 | | 0.027778 | 0.277778 | 0.111111 | 0.083333 | 0.472222 |

TABLE 4

Raw material mixture compositions (mass ratios) in examples and comparative example

| Example | | Si3N4 | AlN | Al2O3 | CaO | SrO | LaN | La2O3 | Eu2O3 |
|---|---|---|---|---|---|---|---|---|---|
| Comparative example | 1 | 56.49 | 7.69 | 3.19 | | | 23.89 | | 9.16 |
| Example | 2 | 51.79 | 12.61 | 10.20 | | 21.52 | | | 4.06 |
| Example | 3 | 51.07 | 11.34 | 8.17 | | 9.05 | 16.701 | | 3.84 |
| Example | 4 | 53.40 | 9.37 | 11.65 | 6.41 | | | | 20.10 |
| Example | 5 | 54.61 | 17.55 | 1.98 | 6.42 | | | 19.03 | 0.41 |
| Example | 6 | 54.46 | 17.50 | 1.98 | 6.27 | | | 18.97 | 0.82 |
| Example | 7 | 54.30 | 17.46 | 1.97 | 6.12 | | | 18.92 | 1.23 |
| Example | 8 | 54.15 | 17.41 | 1.97 | 5.98 | | | 18.87 | 1.63 |
| Example | 9 | 54.00 | 17.36 | 1.96 | 5.83 | | | 18.82 | 2.03 |
| Example | 10 | 53.85 | 17.31 | 1.96 | 5.68 | | | 18.76 | 2.43 |
| Example | 11 | 53.71 | 17.26 | 1.95 | 5.54 | | | 18.71 | 2.83 |
| Example | 12 | 53.56 | 17.22 | 1.95 | 5.40 | | | 18.66 | 3.23 |
| Example | 13 | 53.41 | 17.17 | 1.94 | 5.25 | | | 18.61 | 3.62 |
| Example | 14 | 53.27 | 17.12 | 1.94 | 5.11 | | | 18.56 | 4.01 |
| Example | 15 | 53.28 | 11.83 | 8.52 | 5.11 | | 17.425 | | 3.83 |
| Example | 16 | 53.28 | 11.83 | 8.52 | 5.11 | | 17.425 | | 3.83 |
| Example | 17 | 51.85 | 16.67 | 1.88 | 3.73 | | | 18.06 | 7.81 |

TABLE 5

Firing conditions in examples and comparative example

| Example | | Temperature (° C.) | Ambient pressure (Mpa) | Time (hour) |
|---|---|---|---|---|
| Comparative example | 1 | 1900 | 1 | 2 |
| Example | 2 | 1900 | 1 | 2 |
| Example | 3 | 1950 | 1 | 2 |
| Example | 4 | 1900 | 1 | 2 |
| Example | 5 | 1900 | 1 | 2 |
| Example | 6 | 1900 | 1 | 2 |
| Example | 7 | 1900 | 1 | 2 |
| Example | 8 | 1900 | 1 | 2 |
| Example | 9 | 1900 | 1 | 2 |
| Example | 10 | 1900 | 1 | 2 |
| Example | 11 | 1900 | 1 | 2 |
| Example | 12 | 1900 | 1 | 2 |
| Example | 13 | 1900 | 1 | 2 |
| Example | 14 | 1900 | 1 | 2 |
| Example | 15 | 1800 | 1 | 2 |
| Example | 16 | 1950 | 1 | 2 |
| Example | 17 | 1900 | 1 | 2 |

FIG. 1 is a diagram showing observation results of crystal particles of Comparative example 1 and Examples 2 and 4.

According to FIG. 1, the crystal particles picked up from the synthesized compounds had sizes of several tens of micro meters, respectively. The crystal particle of the Comparative example 1 had a size of 42×45×45 µm$^3$. The crystal particle of the Example 2 had a size of 16×41×20 µm$^3$. The crystal particle of the Example 4 had a size of 46×47×50 µm$^3$.

These crystal particles were analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particles. As a result, presence of La, Eu, Si, Al, O, and N elements was confirmed in the crystal particle of the Comparative example 1, and ratios of the respective numbers of contained atoms of La, Eu, Si, and Al were measured to be 0.75:0.25:5.8:1.2 Presence of Sr, Eu, Si, Al, O and N elements was confirmed in the crystal particle of the Example 2, and ratios of the respective numbers of contained atoms of Sr, Eu, Si, and Al were measured to be 0.9:0.1:4.8:2.2. Presence of Ca, Eu, Si, Al, O and N elements was confirmed in the crystal particle of the Example 4, and ratios of the respective numbers of contained atoms of Ca, Eu, Si, and Al were measured to be 0.5:0.5:5:2.

Next, the crystal particle was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target negative electrode of Mo Kα-line (SMART APEX II Ultra made by Bruker AXS Inc.). As a result, the crystal particle was confirmed to be a single crystal.

The crystal structure was determined using a single crystal structure analysis software (APEX2 made by Bruker AXS Inc.) from the results of X-ray diffraction measurement. The results are summarized in Table 6. It was confirmed that any one of the crystals belonged to the orthorhombic crystal system and belonged to the space group Pbcn. Even if compared with the results of Patent reference 1, any one of α, β, and γ was completely matched and each of the lattice constants a, b, and c was matched within ±1% of relative error, if the averaged value was assumed to be a true value, such that it could be said that they were completely matched in consideration of measurement errors and the like. Further, when a=9.4225, b=9.7561, and c=8.9362 of the results of Patent reference 1 were used as the true values, the calculated relative errors were within ±1%.

TABLE 6

Crystal structure parameters in examples and comparative example

|  |  | Comparative example 1 | Example 2 | Example 4 |
|---|---|---|---|---|
| Crystal system |  | Orthorhombic crystal | | |
| Space group |  | Pbcn | | |
| Lattice constants | a (Å) | 9.3833(1) | 9.4443(1) | 9.4032(6) |
|  | b (Å) | 9.7631(1) | 9.7243(1) | 9.6818(7) |
|  | c (Å) | 8.8870(1) | 8.9343(1) | 8.9251(6) |
|  | α (°) |  | 90 |  |
|  | β (°) |  | 90 |  |
|  | γ (°) |  | 90 |  |

Figure 2:
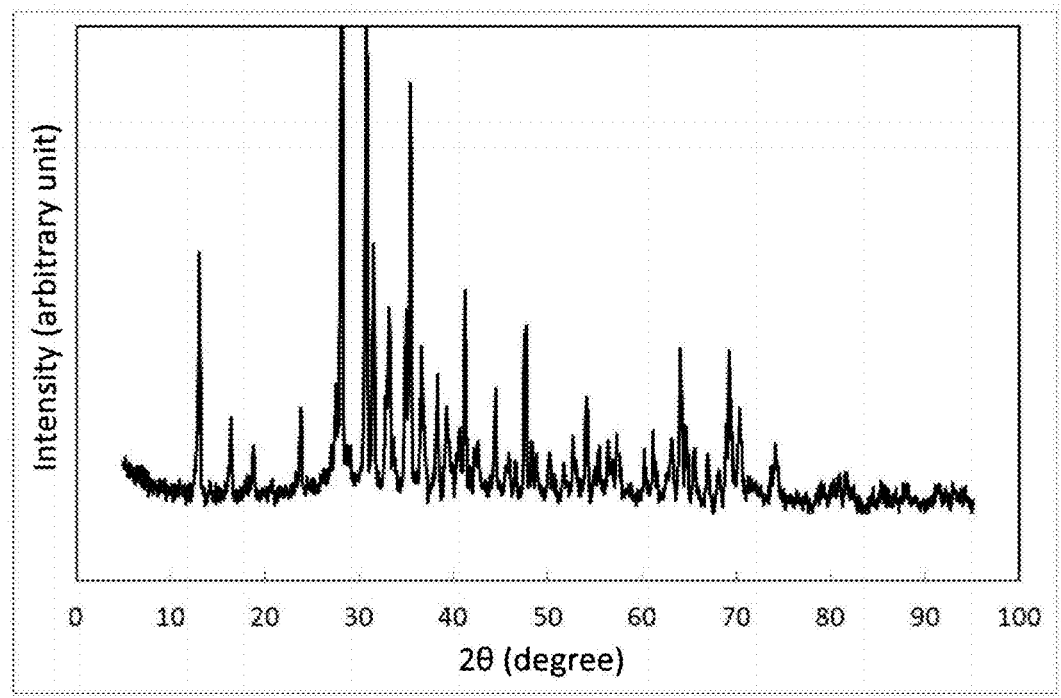
FIG. 2 is a diagram showing an powder X-ray diffraction pattern of a synthesized compound of Example 3.
Figure 3:
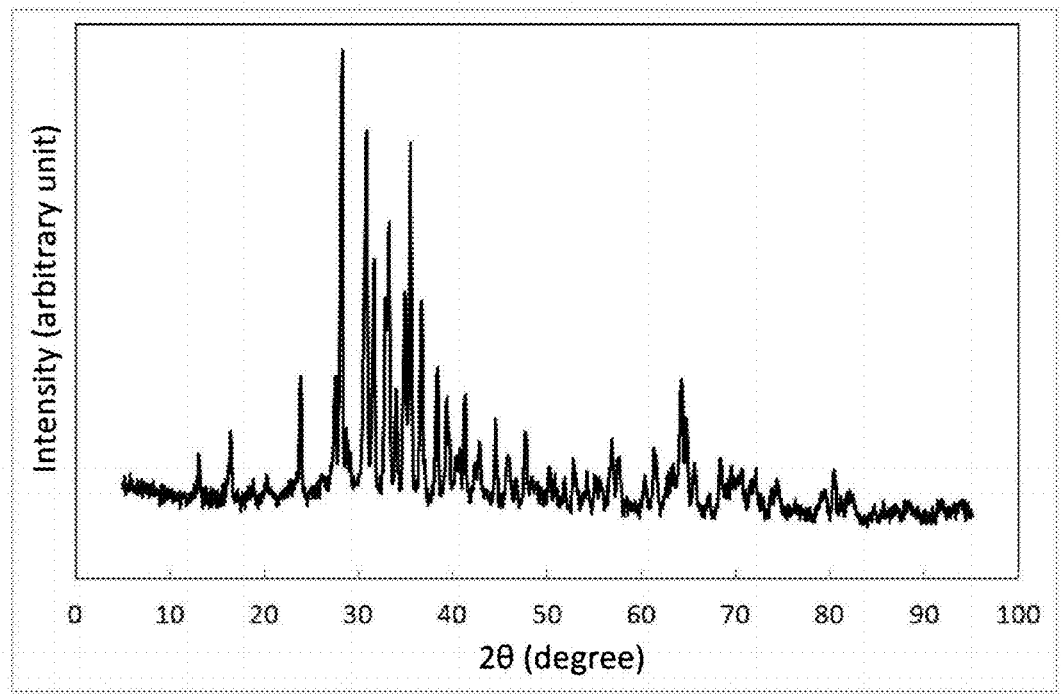
FIG. 3 is a diagram showing an powder X-ray diffraction pattern of a synthesized compound of Example 6.
Figure 4:
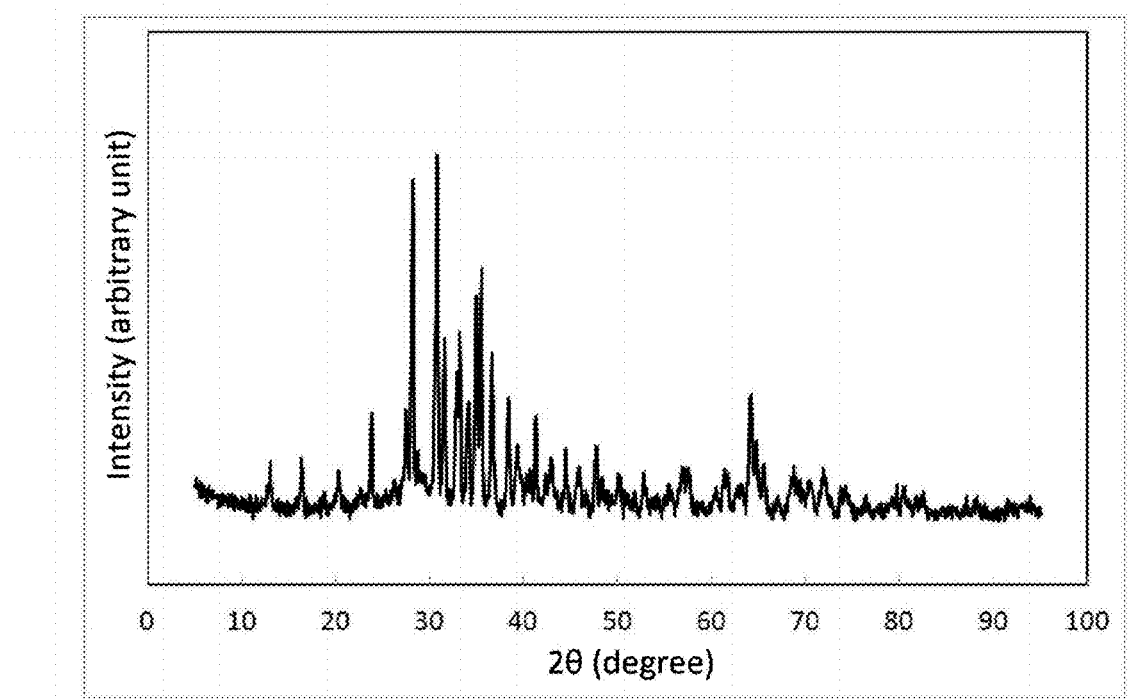
FIG. 4 is a diagram showing an powder X-ray diffraction pattern of a synthesized compound of Example 15.

The thus-obtained synthesized compounds other than the Comparative example 1 and Examples 2 and 4 were ground into a powder state using a pestle and a mortar made of silicon nitride sintered body and the powder X-ray diffraction measurement of the ground powders was performed using Cu Kα-line. Some of the results are shown in FIGS. 2 to 4. As the results, specific patterns of the JEM crystal were shown in the obtained charts. With respect to the measurement results, X-ray diffraction pattern simulation was performed with a software for Rietveld analysis simulation (RIETAN-2000, authored by Fujio Izumi, Asakura Publishing Co., Ltd., Actual practice of powder x-ray analysis) and then it was determined that any one of the synthesized compounds of the Examples was the JEM crystal or comprised the JEM crystal as the main component and the fraction of JEM crystal was 85% or more. Here, it is considered that a portion in which a raw material mixture composition and a chemical composition of the synthesized compound show discrepancy may be caused by having a trace amount of substance mixed in the synthesized product as an impurity secondary phase.

FIG. 2 is a diagram showing a powder X-ray diffraction pattern of a synthesized compound of Example 3.

FIG. 3 is a diagram showing a powder X-ray diffraction pattern of a synthesized compound of Example 6.

FIG. 4 is a diagram showing a powder X-ray diffraction pattern of a synthesized compound of Example 15.

The powder X-ray diffraction results of the synthesized compounds (FIGS. 2 to 4) are the same as the X-ray diffraction pattern of the JEM crystal and it was confirmed that the crystal having the same crystal structure as that of the JEM crystal was the main component.

Further, from the EDS measurements, it was confirmed that the synthesized compound of Example 3 included Eu, Sr, La, Si, Al, O, and N and that the ratios of Eu:Sr:La:Si:Al were 0.1:0.4:0.5:5:2. It was confirmed that the synthesized compound of Example 6 included Eu, Ca, La, Si, Al, O, and N and that the ratios of Eu:Ca:La:Si:Al were 0.02:0.48:0.5:5:2.

From the aforementioned, it was confirmed that the synthesized compounds of Examples of the present invention were inorganic compounds comprising a JEM crystal into which Eu was solid-solved as a main component.

Next, as a result of irradiating light of wavelength of 365 nm onto the single crystals of Comparative example 1 and Examples 2 and 4, and the synthesized compound powders of Examples 3 and 5-17 using a lamp which emits the light, it was confirmed that light of green-to-yellow color was emitted therefrom. These emission spectra and excitation spectra were measured using a spectrophotofluorometer. Some of the results are shown in FIGS. 5 to 10. Peak wavelengths of the excitation spectra and peak wavelengths of the emission spectra are also shown in Table 7.

Figure 5:
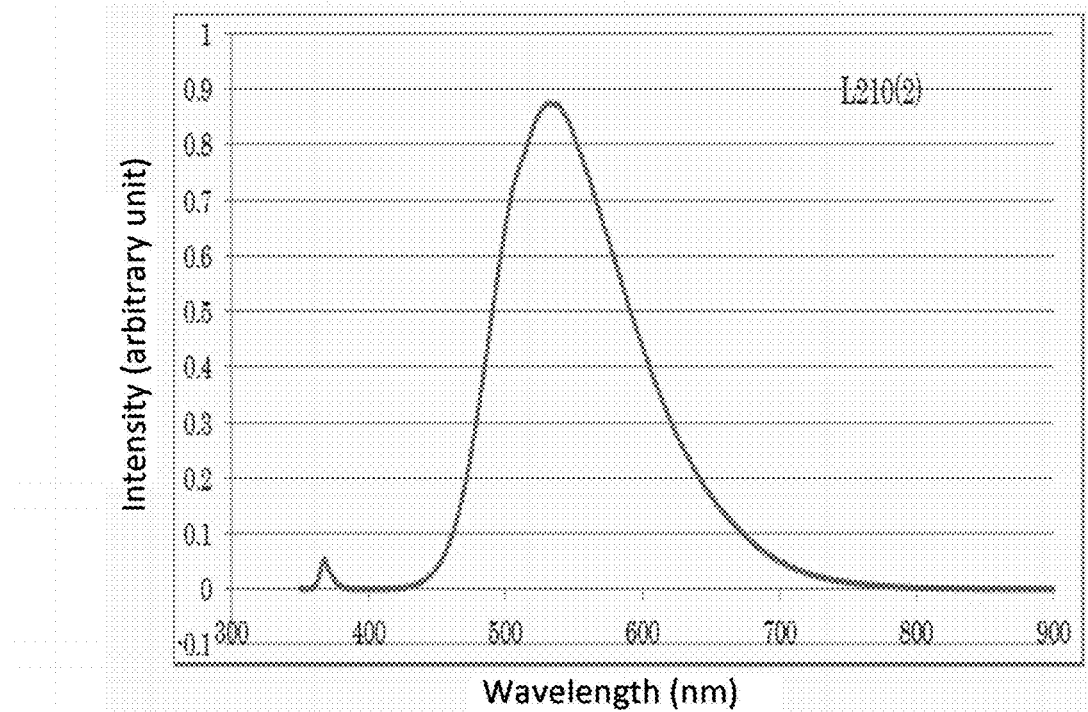
FIG. 5 is a diagram showing an emission spectrum of a crystal particle of Comparative Example 1.

FIG. 5 is a diagram showing an emission spectrum of the crystal particle of Comparative example 1.

Figure 6:
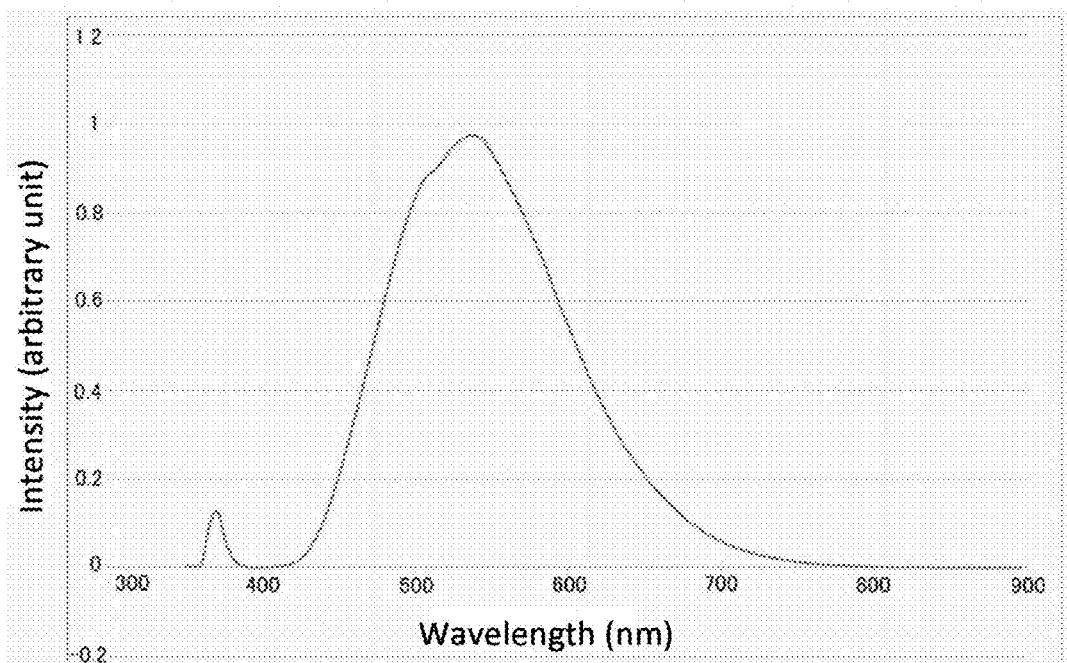
FIG. 6 is a diagram showing an emission spectrum of a crystal particle of Example 2.

FIG. 6 is a diagram showing an emission spectrum of the crystal particle of Example 2.

Figure 7:
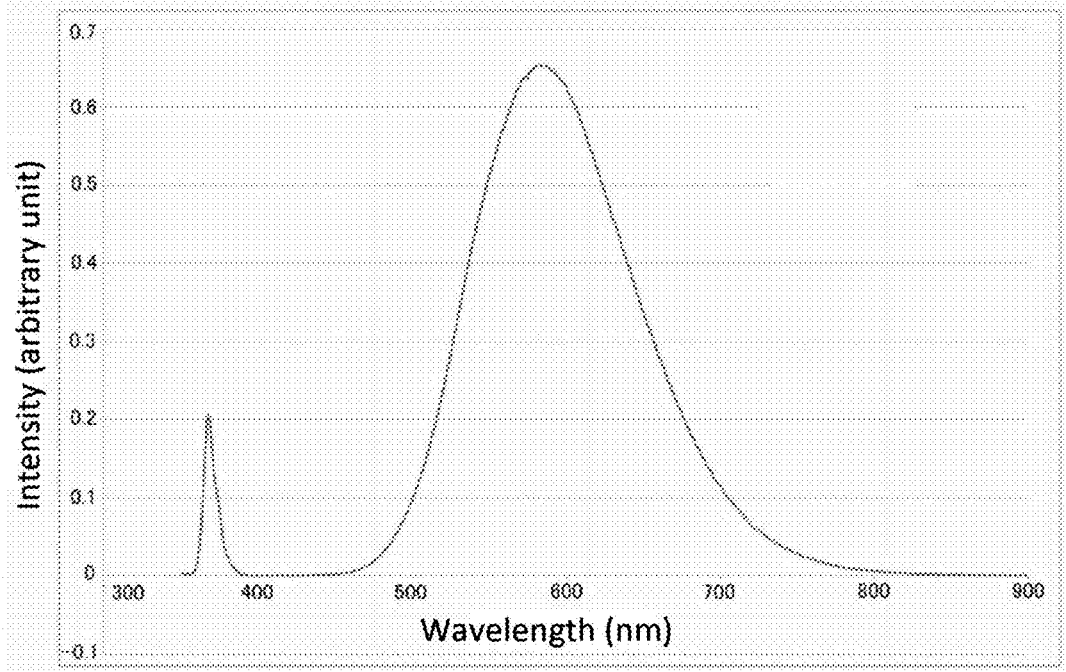
FIG. 7 is a diagram showing an emission spectrum of a crystal particle of Example 4.

FIG. 7 is a diagram showing an emission spectrum of the crystal particle of Example 4.

According to FIG. 5, the synthesized compound (crystal particle) of Comparative example 1 emitted fluorescence of a green color having a peak at the wavelength of 530 nm. According to FIG. 6, the synthesized compound (crystal particle) of Example 2 emitted fluorescence of a green color having a peak at the wavelength of 530 nm. According to FIG. 7, the synthesized compound (crystal particle) of Example 4 emitted fluorescence of a yellow color having a peak at the wavelength of 590 nm.

Figure 8:
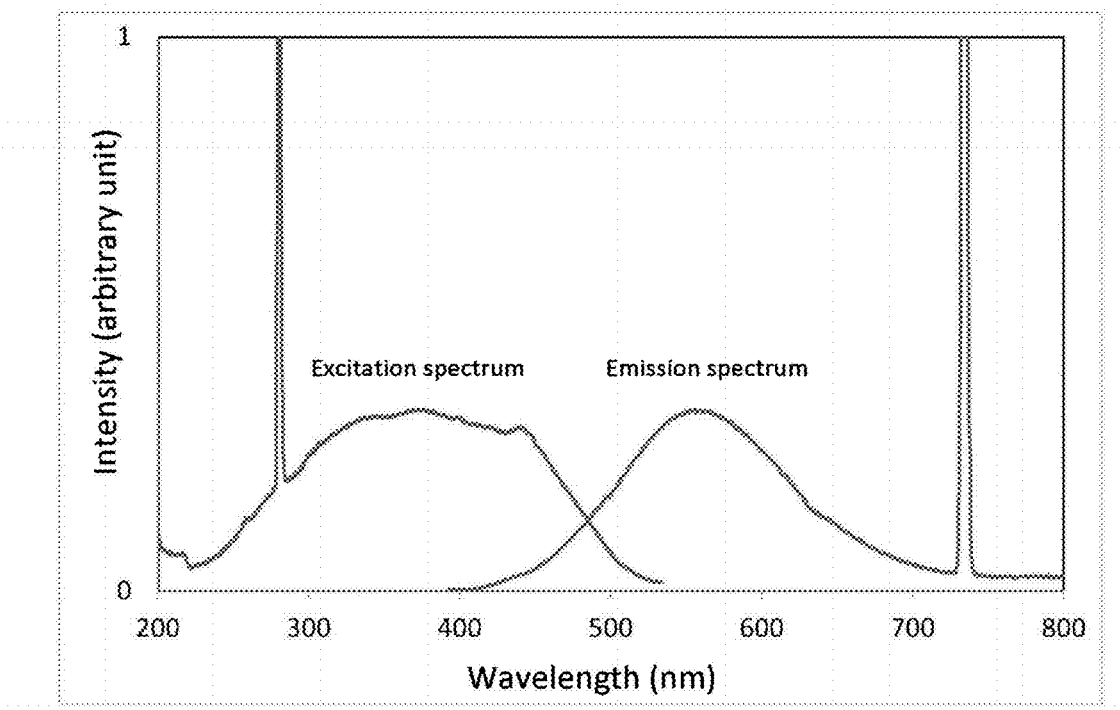
FIG. 8 is a diagram showing excitation and emission spectra of a synthesized compound of Example 3.

FIG. 8 is a diagram showing excitation and emission spectra of a synthesized compound of Example 3.

Figure 9:
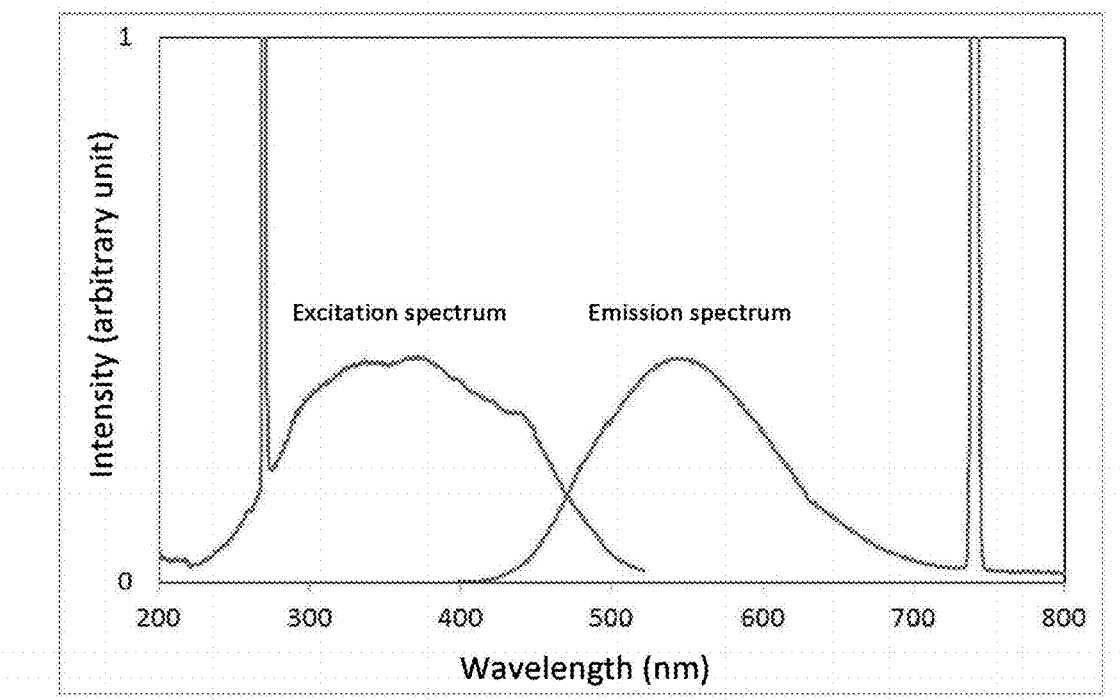
FIG. 9 is a diagram showing an excitation and emission spectra of a synthesized compound of Example 6.

FIG. 9 is a diagram showing excitation and emission spectra of a synthesized compound of Example 6.

Figure 10:
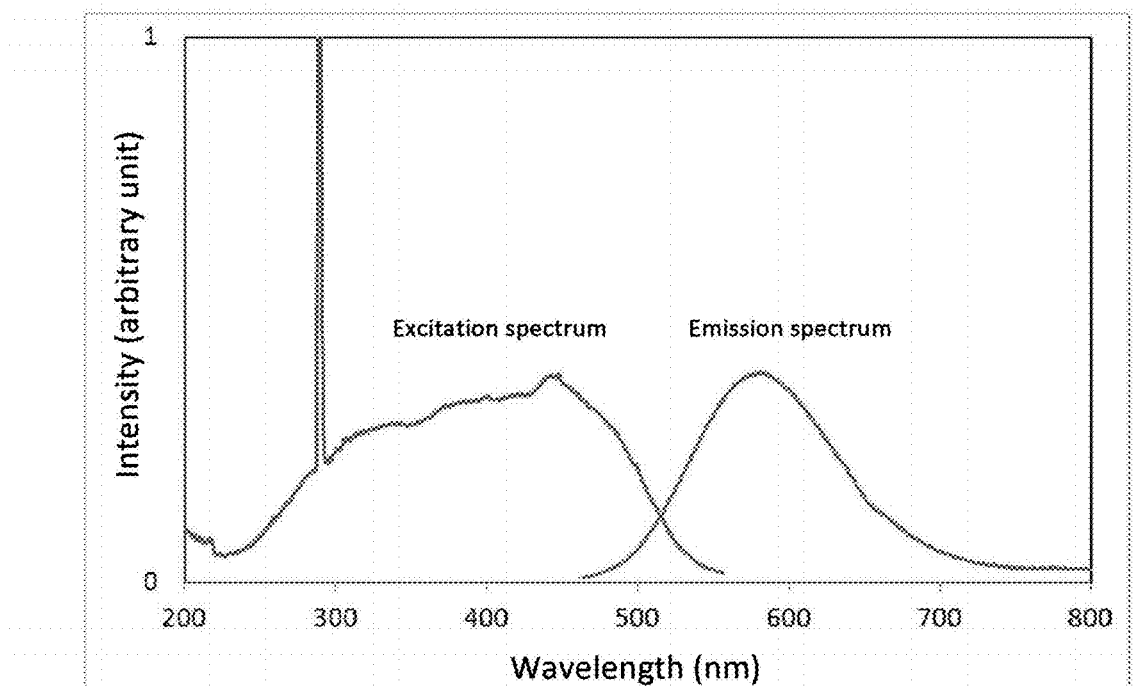
FIG. 10 is a diagram showing excitation and emission spectra of a synthesized compound of Example 15.

FIG. 10 is a diagram showing excitation and emission spectra of a synthesized compound of Example 15.

According to FIG. 8, it was found that the synthesized compound of Example 3 could be excited at 374 nm most efficiently, that the emission spectrum upon excitation of 374 nm had a peak at 556 nm and that the synthesized compound of Example 3 exhibited green color emission. According to FIG. 9, it was found that the synthesized compound of Example 6 could be excited at 371 nm most efficiently, that the emission spectrum upon excitation of 371 nm had a peak at 542 nm and that the synthesized compound of Example 6 exhibited green color emission. According to FIG. 10, it was found that the synthesized compound of Example 15 could be excited at 448 nm most efficiently, that the emission spectrum upon excitation of 448 nm had a peak at 581 nm and that the synthesized compound of Example 15 exhibited yellow color emission.

TABLE 7

Excitation and emission characteristics in examples

| Example | Excitation peak wavelength (nm) | Emission peak wavelength (nm) | Emission intensity (arbitrary unit) |
|---|---|---|---|
| Example 3 | 374 | 556 | 0.33 |
| Example 5 | 331 | 524 | 0.4 |
| Example 6 | 371 | 542 | 0.41 |
| Example 7 | 367 | 549 | 0.3 |
| Example 8 | 376 | 562 | 0.28 |
| Example 9 | 373 | 559 | 0.38 |
| Example 10 | 441 | 573 | 0.36 |
| Example 11 | 443 | 579 | 0.25 |
| Example 12 | 442 | 580 | 0.3 |
| Example 13 | 443 | 583 | 0.23 |
| Example 14 | 440 | 573 | 0.35 |
| Example 15 | 448 | 581 | 0.38 |
| Example 16 | 443 | 581 | 0.32 |
| Example 17 | 442 | 583 | 0.22 |

From the aforementioned, it was confirmed that the synthesized compounds of Examples of the present invention were excited by an ultraviolet ray of 300 nm to 380 nm and violet or blue light of 380 nm to 460 nm; emitted light of green-to-yellow color having peaks in the wavelength range of at least 495 nm and not exceeding 590 nm; and were phosphors comprising inorganic compounds comprising, as the main component, the JEM crystal into which Eu was solid-solved.

More specifically, from Comparative example 1 and Examples 2 to 17, it was found that an inorganic compound comprising, as the main component, the JEM crystal activated with Eu and represented by $MAl(Si, Al)_6(O, N)_{10}$ wherein the M element included at least Eu and Ca and/or Sr was a phosphor emitting light of green-to-yellow color.

Further, according to Examples 2 and 3, it was found that an inorganic compound comprising, as the main component, the JEM crystal activated with Eu wherein the M element included Sr and Eu; or Sr, La, and Eu emitted fluorescence of a green color having a peak in a wavelength range of at least 495 nm and less than 570 nm upon irradiation by an excitation source.

According to Examples 5 to 9, it was found that an inorganic compound comprising, as the main component, the JEM crystal activated with Eu wherein the M element included Ca and Eu; or Ca, La, and Eu and the atomic fraction c of Eu satisfied $0.0003 \leq c < 0.003$ emitted fluorescence of a green color having a peak in a wavelength range of at least 495 nm and less than 570 nm upon irradiation by an excitation source.

On the other hand, according to Examples 4 and 10 to 17, an inorganic compound comprising, as the main component, the JEM crystal activated with Eu wherein the M element included Ca and Eu; or Ca, La, and Eu and the atomic fraction c of Eu satisfied $0.003 \leq c \leq 0.03$ emitted fluorescence of a yellow color having a peak in a wavelength range of at least 570 nm and not exceeding 590 nm upon irradiation by an excitation source.

Figure 11:
FIG. 11 is a diagram showing an object color of a synthesized compound of Example 3.

FIG. 11 is a diagram showing an object color of synthesized compound of Example 3.

Since FIG. 11 is a black-and-white photograph, it is only found that the synthesized compound has a bright color from this figure itself, but it was confirmed that the synthesized compound actually had a yellow object color and was excellent in coloration. Although not shown in the figure, synthesized compounds of other Examples also exhibited similar object color. The inorganic compounds of the synthesized compounds according to the present invention exhibited the object color of yellow by irradiation of the sunlight or an illumination such as a fluorescent lamp such that it was found that they could be utilized for the pigment or the fluorescent pigment.

Examples of Light-Emitting Device and Image Display Device; Examples 18 to 21

Next, a light-emitting device utilizing the phosphor of the present invention will be described.

Example 18

Figure 12:
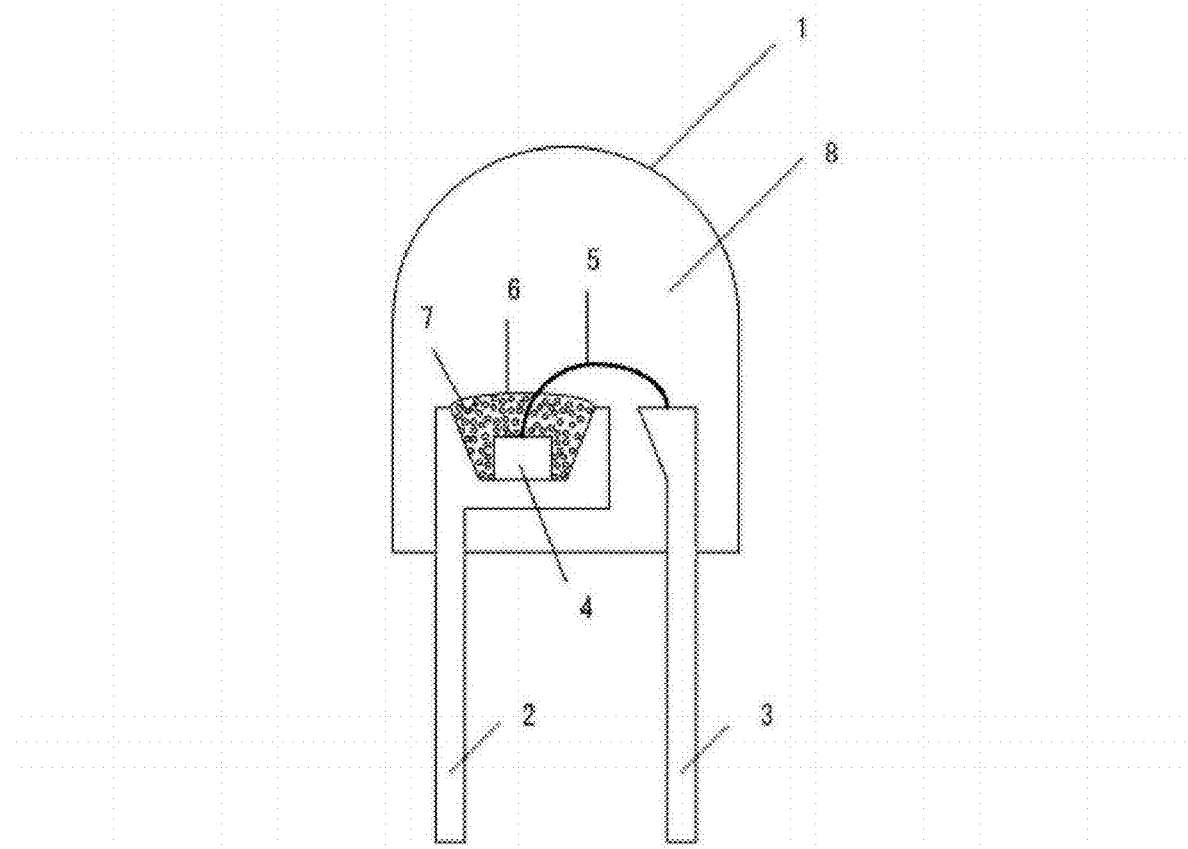
FIG. 12 is a schematic diagram showing an illuminating device (a bullet-type of LED illuminating device) according to the present invention.

FIG. 12 is a schematic diagram showing an illuminating device (bullet-type of LED illuminating device) corresponding to the light-emitting device according to the present invention.

A so-called bullet-type white light-emitting diode lamp (1) shown in FIG. 12 was manufactured. There are two lead wires (2, 3), one of which (2) has a recess, in which an ultraviolet light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a gold thin wire (5). The phosphor (7) is dispersed in resin and mounted in the vicinity of the ultraviolet light-emitting diode element (4). The first resin (6) in which this phosphor is dispersed is transparent, and covers the entire ultraviolet light-emitting diode element (4). The tip-top portion of the lead wire including the recess, the ultraviolet light-emitting diode element, and the first resin in which the phosphor is dispersed are sealed with transparent second resin (8). The transparent second resin (8) is formed approximately in a cylindrical shape as a whole and the top portion is rounded in a lens shape such that the lamp is generally referred to as a bullet-type.

In the present embodiment, the yellow phosphor prepared for Example 15 and the blue phosphor of JEM:Ce were mixed at the mass ratio of 7:3 to make a phosphor powder, which was further mixed into epoxy resin at the concentration of 37 wt %, and this resultant mixture was dropped in an appropriate amount with a dispenser such that the first resin (6) was formed in which phosphor-mixed droplets (7) were dispersed. The light emitted by the thus-obtained light-emitting device had an emission color of white and characterized by x=0.33 and y=0.33.

Example 19

Figure 13:
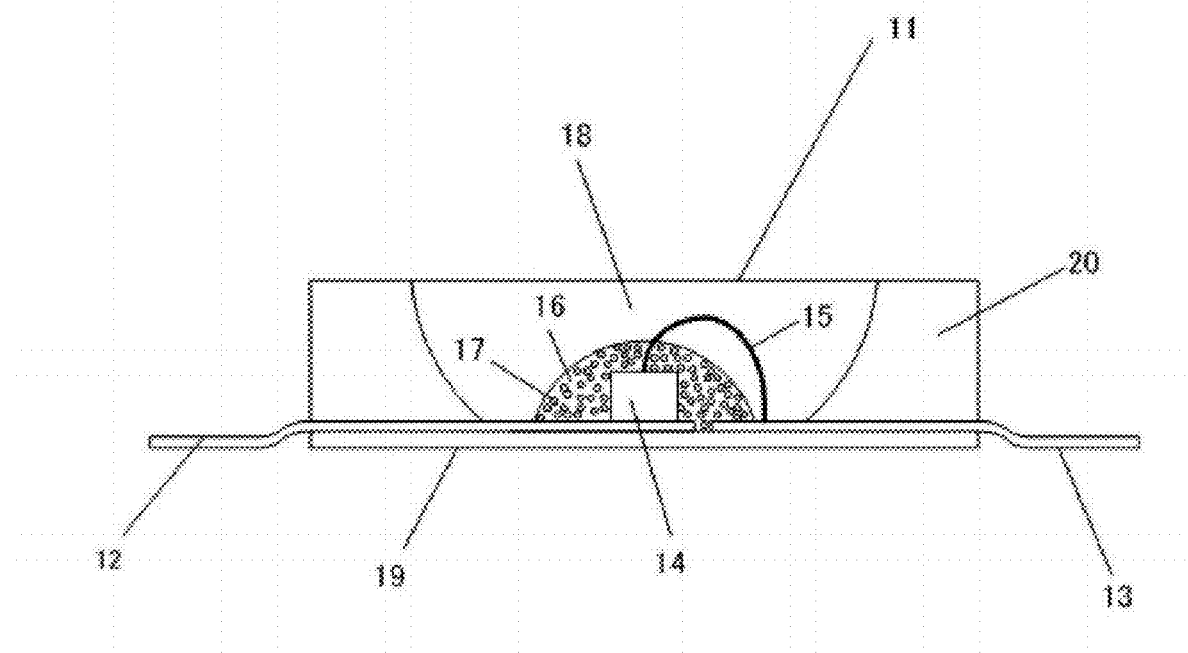
FIG. 13 is a schematic diagram showing an illuminating device (a board-mounting-type LED illuminating device) according to the present invention.

FIG. 13 is a schematic diagram showing an illuminating device (board-mounting-type LED illuminating device) corresponding to the light emitting device according to the present invention.

A chip-type white light-emitting diode lamp (11) for board-mounting as shown in FIG. 13 was manufactured. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which an blue light-emitting diode element (14) having an emission peak wavelength of 450 nm is placed and fixed thereto such that the element is located at the center of the board. The lower electrode of the blue light-emitting diode element (14) and the lead wire below are electrically connected with conductive paste, and the upper electrode and the other lead wire (13) are electrically connected through a gold thin wire (15).

A material prepared by mixing the first resin (16) and a blended phosphor (17) prepared by blending the yellow phosphor prepared for Example 15 and a red phosphor of $CaAlSiN_3$:Eu with the mass ratio of 9:1 is mounted in the vicinity of the light-emitting diode element. The first resin (16) in which this phosphor is dispersed is transparent, and covers the entire blue light-emitting diode element (14). Also, a wall surface member (20) having a hole opened at the center portion is fixed to the ceramic board. The wall surface member (20) has the center portion formed as the hole in which the blue color light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. The hole at the center portion of the wall surface member is formed with a recess as the final shape of the chip-type light-emitting diode lamp, and is filled up with second transparent resin (18) to seal all of the blue light-emitting diode element (14) and the first resin (16) in which the phosphor (17) is dispersed. In the present example, the same epoxy resin was used for both the first resin (16) and second resin (18). The thus-achieved chromaticity and the like are approximately the same as those of Example 18.

Next, an example of design of an image display device using the phosphor of the present invention will be described.

Example 20

Figure 14:
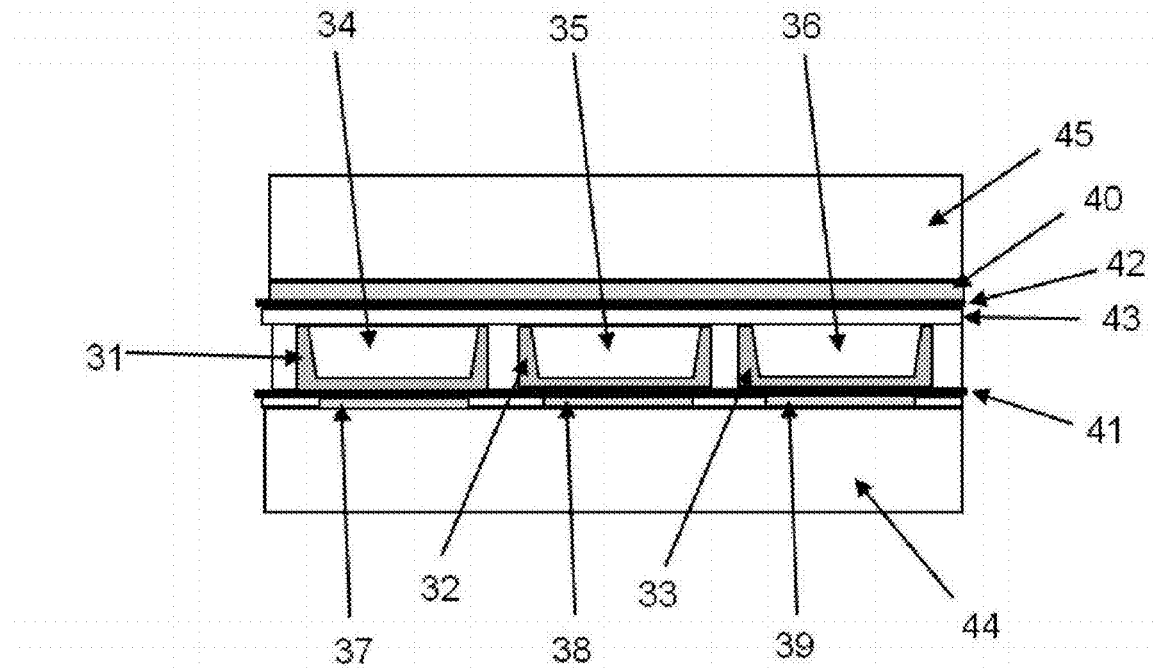
FIG. 14 is a schematic diagram showing an image display device (a plasma display panel) according to the present invention.

FIG. 14 is a schematic diagram showing an image display device (plasma display panel) according to the present invention.

A red phosphor ($CaAlSiN_3$:Eu) (31), a green phosphor (32) of Example 9 according to the present invention, and the blue phosphor (JEM:Ce) (33) are applied to inner surfaces of the respective cells (34, 35, 36), which are arranged via electrodes (37, 38, 39) and a dielectric layer (41) over a glass substrate (44). If electric power is supplied to the electrodes (37, 38, 39, 40), a vacuum ultraviolet ray is generated by Xe discharge in each of the cells, thereby exciting the respective phosphors so as to emit visible light of a red color, a green color, or a blue color such that the emitted light may be observed from the outside through a protective layer (43), a dielectric layer (42), and a glass substrate (45) so as to serve as an image display device.

Example 21

Figure 15:
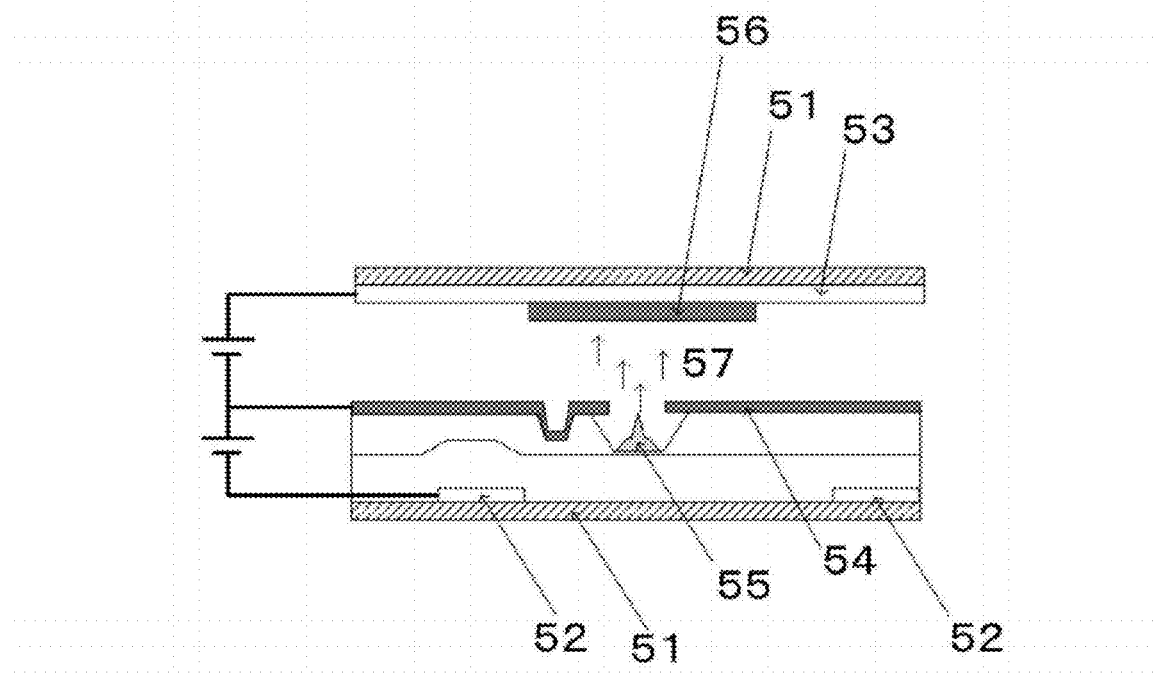
FIG. 15 is a schematic diagram showing an image display device (a field emission display panel) according to the present invention.

FIG. 15 is a schematic diagram showing an image display device (field emission display panel) according to the present invention.

The green phosphor (56) of Example 6 of the present invention is applied to an interior surface of an anode (53). By applying a voltage between a cathode (52) and a gate (54), electrons (57) are emitted from an emitter (55). The electrons are accelerated by the voltage between the anode (53) and cathode, and impinge on the green phosphor (56) to excite the phosphor to emit light. The entire device is protected by a glass (51). Although the drawing shows a single light emission cell comprising one emitter and one phosphor, a display is actually configured to emit light of a variety of color by arranging many cells for a red color and a blue color in addition to for a green color. Although the phosphors used for red and blue cells are not particularly specified, a phosphor which exhibits high brightness with a low speed electron beam is preferable.

INDUSTRIAL APPLICABILITY

The phosphor of the present invention comprises the JEM crystal as the main component and has different emission characteristics (emission color and excitation characteristics, emission spectrum) from those of the conventional JEM phosphor, exhibits high emission intensity in the case where it is combined with a LED of 470 nm or less, is chemically and thermally stable, and further has little degradation in the intensity of the phosphor when it is exposed to the excitation source such that it is an oxynitride phosphor to be used suitably for the VFD, the FED, the PDP, the CRT, the LCD, the white LED, and so on. It is expected that the phosphor of the present invention will be utilized in material design in various kinds of display devices in the future so as to contribute to the development of the industry.

EXPLANATION OF NUMERALS 1. bullet-type light-emitting diode lamp.
2, 3. lead wire.
4. light-emitting diode element.
5. gold thin wire.
6, 8. resin.
7. phosphor
11. chip-type white light-emitting diode lamp for board-mounting.
12, 13. lead wire.
14. light-emitting diode element.
15. gold thin wire.
16, 18. resin.
17. phosphor.
19. alumina ceramic board.
20. wall surface member.
31. red phosphor.
32. green phosphor.
33. blue phosphor.
34, 35, 36. ultraviolet ray emission cell.
37, 38, 39, 40. electrode.
41, 42. dielectric layer.
43. protective layer.
44, 45. glass substrate
51. glass.

52. cathode.
53. anode.
54. gate.
55. emitter.
56. phosphor.
57. electrons.

What is claimed is:

1. A phosphor comprising a JEM crystal activated with Eu and represented by $MAl(Si, Al)_6(O, N)_{10}$ (wherein an M element is one or two or more kinds of elements selected from a group consisting of Ca, Sr, Eu, La, Sc, Y, and lanthanoid elements; the M element includes at least Eu; and the M element includes Ca and/or Sr).

2. The phosphor according to claim 1, wherein the phosphor is represented by $Ca_aSr_bEu_cLa_dSi_eAl_fO_gN_h$ and the parameters: a, b, c, d, e, f, g, and h (wherein a+b+c+d+e+f+g+h=1) satisfy condition:

$0.02 \leq a+b+d \leq 0.06$, $0.0003 \leq c \leq 0.03$, $0.1 \leq e \leq 0.5$, $0.02 \leq f \leq 0.3$, $0.02 \leq g \leq 0.3$, $0.3 \leq h \leq 0.6$, and $0 < a+b$.

3. The phosphor according to claim 1 wherein the JEM crystal activated with Eu is represented by $((Ca)_t, Eu_u, La_x)AlSi_{6-z}Al_zN_{10-z-t-u}O_{z+t+u}$, $((Sr)_t, Eu_u, La_x)AlSi_{6-z}Al_zN_{10-z-t-u}O_{z+t+u}$, or $((Ca, Sr)_t, Eu_u, La_x)AlSi_{6-z}Al_zN_{10-z-t-u}O_{z+t+u}$ and the parameters: t, u, x, and z (wherein t+u+x=1) satisfy condition:

$0.3 \leq t < 1$, $0.005 \leq u \leq 0.2$, and $0.5 \leq z \leq 2$.

4. The phosphor according to claim 3 wherein the parameter x satisfies x=0.

5. The phosphor according to claim 3 wherein the parameter z satisfies condition: $0.5 \leq z \leq 1.5$.

6. The phosphor according to claim 1 wherein:
the M element is Sr and Eu; or Sr, La, and Eu and
fluorescence having a peak in a wavelength range of at least 495 nm and less than 570 nm is emitted upon irradiation by an excitation source.

7. The phosphor according to claim 1 wherein:
the M element is Ca and Eu; or Ca, La, and Eu,
an atomic fraction of Eu satisfies condition of being at least 0.003 and not exceeding 0.03, and
fluorescence having a peak in a wavelength range of at least 570 nm and not exceeding 590 nm is emitted upon irradiation by an excitation source.

8. The phosphor according to claim 1 wherein:
the M element is Ca and Eu; or Ca, La, and Eu,
an atomic fraction of Eu satisfies condition of being at least 0.0003 and less than 0.003, and
fluorescence having a peak in a wavelength range of at least 495 nm and less than 570 nm is emitted upon irradiation by an excitation source.

9. A light emitting device comprising at least a light-emitting body and a phosphor wherein the phosphor comprises at least a phosphor recited in claim 1.

10. The light emitting device according to claim 9 wherein the light-emitting body is a light-emitting diode (LED), a laser diode (LD), a semiconductor laser, an organic EL light-emitting body (OLED), or a fluorescent lamp, which emits light having a wavelength of 330 to 495 nm.

11. The light emitting device according to claim 9 wherein the light emitting device is a white color light-emitting diode or an illuminating device including a plurality of white color light-emitting diodes or a backlight for a liquid-crystal display panel.

12. The light emitting device according to claim 9 wherein the phosphor further comprises a blue phosphor to emit light having a peak wavelength of 420 nm to 500 nm by the light-emitting body.

13. The light emitting device according to claim 12 wherein the blue phosphor is selected from a group consisting of $AlN:(Eu, Si)$, $BaMgAl_{10}O_{17}:Eu$, $SrSi_9Al_{19}ON_{31}:Eu$, $LaSi_9Al_{19}N_{32}:Eu$, α-sialon:Ce, and JEM:Ce.

14. The light emitting device according to claim 9 wherein the phosphor further comprises a green phosphor to emit light having a peak wavelength of at least 500 nm and not exceeding 550 nm by the light-emitting body.

15. The light emitting device according to claim 9 wherein the phosphor further comprises a red phosphor to emit light having a peak wavelength of at least 600 nm and not exceeding 700 nm by the light-emitting body.

16. The light emitting device according to claim 15 wherein the red phosphor is selected from a group consisting of $CaAlSiN_3:Eu$, $(Ca, Sr)AlSiN_3:Eu$, $Ca_2Si_5N_8:Eu$, and $Sr_2Si_5N_8:Eu$.

17. An image display device comprising at least an excitation source and a phosphor wherein the phosphor comprises at least a phosphor recited in claim 1.

18. The image display device according to claim 17 wherein the image display device is any of a liquid crystal display (LCD), a fluorescent display tube (VFD), a field emission display (FED), a plasma display panel (PDP), and a cathode-ray tube (CRT).

19. A pigment comprising a JEM crystal activated with Eu recited in claim 1.

20. An ultraviolet absorber comprising a JEM crystal activated with Eu recited in claim 1.

* * * * *